(12) United States Patent
Srinivasan et al.

(10) Patent No.: US 11,276,465 B1
(45) Date of Patent: Mar. 15, 2022

(54) DEVICE, SYSTEM AND METHOD TO FLOAT A DECODER FOR DESELECTED ADDRESS LINES IN A THREE-DIMENSIONAL CROSSPOINT MEMORY ARCHITECTURE

(71) Applicant: Intel Corporation, Santa Clara, CA (US)

(72) Inventors: Balaji Srinivasan, Folsom, CA (US); Mase J. Taub, Folsom, CA (US); DerChang Kau, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 6 days.

(21) Appl. No.: 16/947,886

(22) Filed: Aug. 21, 2020

(51) Int. Cl.
| | | |
|---|---|---|
| *G11C 16/08* | (2006.01) | |
| *G11C 16/24* | (2006.01) | |
| *G11C 16/30* | (2006.01) | |
| *G11C 16/26* | (2006.01) | |
| *G11C 16/10* | (2006.01) | |
| *G11C 16/04* | (2006.01) | |

(52) U.S. Cl.
CPC .......... *G11C 16/08* (2013.01); *G11C 16/0433* (2013.01); *G11C 16/10* (2013.01); *G11C 16/24* (2013.01); *G11C 16/26* (2013.01); *G11C 16/30* (2013.01)

(58) Field of Classification Search
CPC ..... G11C 16/08; G11C 16/0433; G11C 16/10; G11C 16/24; G11C 16/26; G11C 16/30
USPC ........................................ 365/185.24, 230.06
See application file for complete search history.

(56) References Cited

U.S. PATENT DOCUMENTS

| | | | |
|---|---|---|---|
| 10,636,490 B1 * | 4/2020 | Lin ...................... | G11C 16/26 |
| 10,636,498 B1 * | 4/2020 | Lien ................... | G11C 16/3459 |
| 10,878,905 B1 * | 12/2020 | McCollum .......... | G11C 13/004 |
| 10,943,662 B1 * | 3/2021 | Linnen ................ | G11C 11/5635 |
| 2019/0013071 A1 | 1/2019 | Srinivasan et al. | |
| 2019/0035481 A1 * | 1/2019 | Kim .................... | G11C 16/3445 |
| 2019/0066789 A1 * | 2/2019 | Sakai ................... | G11C 5/148 |
| 2020/0006379 A1 * | 1/2020 | Nishikawa .......... | G11C 16/0483 |
| 2020/0152273 A1 * | 5/2020 | Lee ..................... | G11C 16/24 |
| 2020/0185032 A1 * | 6/2020 | Lin ...................... | G11C 7/1006 |
| 2020/0273508 A1 | 8/2020 | Srinivasan et al. | |
| 2020/0301667 A1 * | 9/2020 | Hung ................... | G11C 16/0483 |
| 2020/0321058 A1 * | 10/2020 | Lee ..................... | G11C 16/24 |
| 2020/0321066 A1 * | 10/2020 | Oh ....................... | G11C 16/3445 |
| 2021/0012834 A1 * | 1/2021 | Hsu ..................... | G11C 11/5671 |
| 2021/0019608 A1 * | 1/2021 | Tran .................... | G11C 16/10 |
| 2021/0082516 A1 * | 3/2021 | Tran .................... | G11C 16/0425 |

(Continued)

*Primary Examiner* — Michael T Tran
(74) *Attorney, Agent, or Firm* — Alliance IP, LLC

(57) ABSTRACT

A method, apparatus and system to address memory cells in a memory array that includes address lines comprising wordlines (WLs) and bitlines (BLs). The method comprises: controlling a decoder circuitry of a memory array, the memory array including a plurality of WLs and a plurality of BLs, the decoder circuitry including a plurality of switches coupled respectively to the WLs, or respectively to the BLs; and causing a selected switch of the plurality of switches to change a bias of a corresponding selected address line coupled thereto from a floating bias at an idle state of the decoder circuitry to either a positive bias or a negative bias without changing a bias at deselected address lines corresponding to deselected switches of the plurality of switches from the floating bias at the idle state.

25 Claims, 10 Drawing Sheets

(56) References Cited

U.S. PATENT DOCUMENTS

2021/0202018 A1\* 7/2021 Hirst ................ G11C 16/34
2021/0217476 A1\* 7/2021 Shirakawa ............ G11C 16/10

\* cited by examiner

DEVICE, SYSTEM AND METHOD TO FLOAT A DECODER FOR DESELECTED ADDRESS LINES IN A THREE-DIMENSIONAL CROSSPOINT MEMORY ARCHITECTURE

FIELD

The present disclosure relates in general to the field of computer development, and more specifically, to switch circuitries for three-dimensional crosspoint (3D crosspoint) memory array architectures.

BACKGROUND

A storage device may include non-volatile memory, such as multi-stack 3D crosspoint memory cells or arrays. Decoders (which typically are part of memory device switch circuitries) are generally used to select and deselect either wordlines or bitlines of a given memory array in a 3D crosspoint architecture. A decoder may include a plurality of switches (e.g., from hundreds to thousands of switches depending on the size of the memory array).

The process of selecting an address line, such as either a wordline (WL) or bitline (BL), typically entails a high amount of energy expenditure to switch transistors to effect the selection, where the power to the switch a transistor is a function of the capacitance between two given nodes times the square of a voltage differential between the two nodes (or $CV^2$). Such high energy expenditure in decoder addressing can occur for example where multiple transistors require their gate biases to be changed from an idle bias to result in the address line connected thereto to be deselected in a decoder addressing operation, and to therefore allow a given address line to be selected.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

Figure 1:
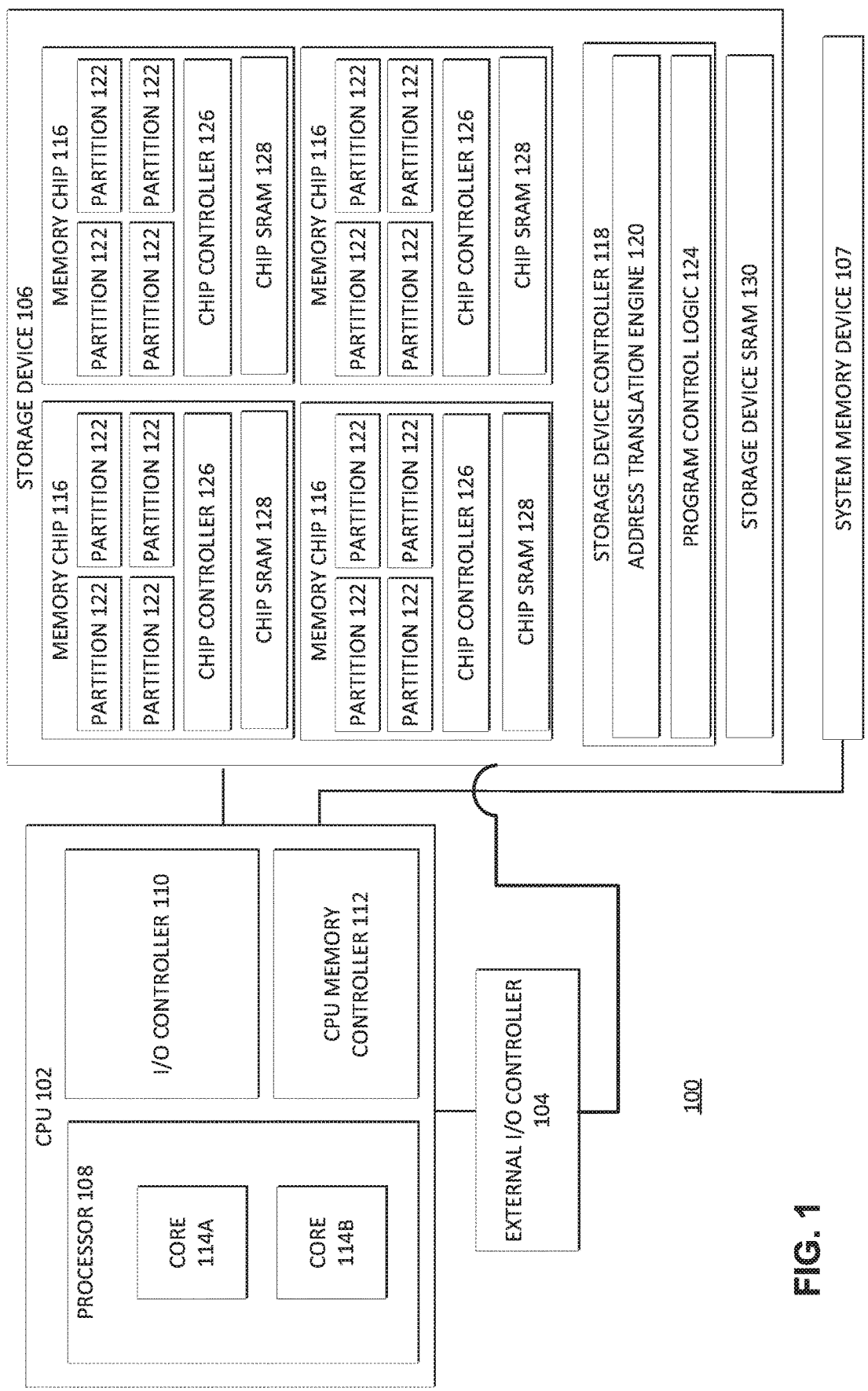
FIG. 1 is a schematic illustration of a block diagram of components of a computer system according to some embodiments.

FIG. 1 illustrates a block diagram of components of a computer system 100 in accordance with some embodiments. System 100 includes a central processing unit (CPU) 102 coupled to an external input/output (I/O) controller 104, a storage device 106 such as a solid state drive (SSD), and system memory device 107. During operation, data may be transferred between a storage device 106 and/or system memory device 107 and the CPU 102. In various embodiments, particular memory access operations (e.g., read and write operations) involving a storage device 106 or system memory device 107 may be issued by an operating system and/or other software applications executed by processor 108. In various embodiments, a storage device 106 may include a storage device controller 118 and one or more memory chips 116 that each comprise any suitable number of memory partitions 122.

In various embodiments, a memory partition 122 may include a 3D crosspoint memory array. In some embodiments, a 3D crosspoint memory array may comprise a transistor-less (e.g., at least with respect to the data storage elements of the memory) stackable crosspoint architecture in which memory cells sit at the intersection of row address lines and column address lines arranged in a grid.

During a read operation, a differential bias sometimes referred to as a demarcation voltage (VDM) may be applied across the terminals of the memory cell and the state of the memory cell may be sensed based on the reaction of the memory cell to the applied bias. For example, the memory cell may either go into a conductive ON state (logic one) or remain in a weakly conductive OFF state (logic zero). The applied voltage at which a memory cell transitions from being sensed as a logic one to being sensed as a logic zero may be termed a threshold voltage of the memory cell. Thus, as an example, when the VDM is higher than the threshold voltage of the memory cell, the memory cell may be sensed as storing a logic one and when the VDM is lower than the threshold voltage of the memory cell, the memory cell may be sensed as storing a logic zero.

CPU 102 comprises a processor 108, such as a microprocessor, an embedded processor, a digital signal processor (DSP), a network processor, a handheld processor, an application processor, a co-processor, an SOC, or other device to execute code (e.g., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric. CPU 102 may be referred to herein as a host computing device (though a host computing device may be any suitable computing device operable to issue memory access commands to a storage device 106).

A processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 (e.g., 114A or 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

The processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable logic capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input device such as a monitor, printer, mouse, keyboard, or scanner; or other suitable device. In a particular embodiment, an I/O device may comprise storage device controller 118 of storage device 106 coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and an associated I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller 110 may be located off-chip (e.g., not on the same chip as CPU 102) or may be integrated on the same chip as the CPU 102.

CPU memory controller 112 is an integrated memory controller that controls the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store temporary data, persistent data (e.g., a user's files or instruction sequences) that maintains its state even after power to the system memory device 107 is removed, or a combination thereof. A system memory device 107 may be dedicated to a particular CPU 102 or shared with other devices (e.g., one or more other processors or other devices) of computer system 100.

In various embodiments, a system memory device 107 may include a memory comprising any number of memory partitions, a memory device controller, and other supporting logic (not shown). A memory partition may include non-volatile memory and/or volatile memory.

Non-volatile memory is a storage medium that does not require power to maintain the state of data stored by the medium, thus non-volatile memory may have a determinate state even if power is interrupted to the device housing the memory. In various embodiments, non-volatile memory may be byte or block addressable. Nonlimiting examples of nonvolatile memory may include any or a combination of: solid state memory (such as planar or 3-dimensional (3D) NAND flash memory or NOR flash memory), 3D crosspoint memory, phase change memory or SXP memory (e.g., memory that uses a chalcogenide glass phase change material in the memory cells), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable programmable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magnetoresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory.

Volatile memory is a storage medium that requires power to maintain the state of data stored by the medium (thus volatile memory is memory whose state (and therefore the data stored on it) is indeterminate if power is interrupted to the device housing the memory). Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5, originally published by JEDEC in January 2020, HBM2 (HBM version 2), originally published by JEDEC in January 2020, or others or combinations of memory technologies, and technologies based on derivatives or extensions of such specifications.

A storage device 106 may store any suitable data, such as data used by processor 108 to provide functionality of computer system 100. For example, data associated with programs that are executed or files accessed by cores 114A and 114B may be stored in storage device 106. A storage device 106 may store data and/or sequences of instructions that are executed or otherwise used by the cores 114A and 114B. In various embodiments, a storage device 106 may store persistent data (e.g., a user's files or software application code) that maintains its state even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and four memory chips 116 each comprising four memory partitions 122 operable to store data, however, a storage device may include any suitable number of memory chips each having any suitable number of memory partitions. A memory partition 122 includes a plurality of memory cells operable to store data. The cells of a memory partition 122 may be arranged in any suitable fashion, such as in rows (e.g., wordlines) and columns (e.g., bitlines), three dimensional structures, sectors, or in other ways. In various embodiments, the cells may be logically grouped into banks, blocks, subblocks, wordlines, pages, frames, bytes, slices, or other suitable groups. In various embodiments, a memory partition 122 may include any of the volatile or non-volatile memories listed above or other suitable memory. In a particular embodiment, each memory partition 122 comprises one or more 3D crosspoint memory arrays. 3D crosspoint arrays are described in more detail in connection with the following figures.

In various embodiments, storage device 106 may comprise a solid state drive; a memory card; a Universal Serial Bus (USB) drive; a Non-Volatile Dual In-line Memory Module (NVDIMM); storage integrated within a device such as a smartphone, camera, or media player; or other suitable mass storage device.

In a particular embodiment, one or more memory chips 116 are embodied in a semiconductor package. In various embodiments, a semiconductor package may comprise a casing comprising one or more semiconductor chips (also referred to as dies). A package may also comprise contact pins or leads used to connect to external circuits. In various embodiments, a memory chip may include one or more memory partitions 122.

Accordingly, in some embodiments, storage device 106 may comprise a package that includes a plurality of chips that each include one or more memory partitions 122. However, a storage device 106 may include any suitable arrangement of one or more memory partitions and associated logic in any suitable physical arrangement. For example, memory partitions 122 may be embodied in one or more different physical mediums, such as a circuit board, semiconductor package, semiconductor chip, disk drive, other medium, or any combination thereof.

System memory device 107 and storage device 106 may comprise any suitable types of memory and are not limited to a particular speed, technology, or form factor of memory in various embodiments. For example, a storage device 106 may be a disk drive (such as a solid-state drive), a flash drive, memory integrated with a computing device (e.g., memory integrated on a circuit board of the computing device), a memory module (e.g., a dual in-line memory module) that may be inserted in a memory socket, or other type of storage device. Similarly, system memory 107 may have any suitable form factor. Moreover, computer system 100 may include multiple different types of storage devices.

System memory device 107 or storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. A system memory device 107 or storage device 106 may also include a communication interface to communicate with CPU memory controller 112 or I/O controller 110 in accordance with any suitable logical device interface specification such as NVMe, AHCI, or other suitable specification. In particular embodiments, system memory device 107 or storage device 106 may comprise multiple communication interfaces that each communicate using a separate protocol with CPU memory controller 112 and/or I/O controller 110.

Storage device controller 118 may include logic to receive requests from CPU 102 (e.g., via an interface that communicates with CPU memory controller 112 or I/O controller 110), cause the requests to be carried out with respect to the memory chips 116, and provide data associated with the requests to CPU 102 (e.g., via CPU memory controller 112 or I/O controller 110). Storage device controller 118 may also be operable to detect and/or correct errors encountered during memory operations via an error correction code (ECC engine). In an embodiment, controller 118 also tracks, e.g., via a wear leveling engine, the number of times particular cells (or logical groupings of cells) have been written to in order to perform wear leveling, detect when cells are nearing an estimated number of times they may be reliably written to, and/or adjust read operations based on the number of times cells have been written to. In performing wear leveling, the storage device controller 118 may evenly spread out write operations among the cells of memory chips 116 in an attempt to equalize the number of operations (e.g., write operations) performed by each cell. In various embodiments, controller 118 may also monitor various characteristics of the storage device 106 such as the temperature or voltage and report associated statistics to the CPU 102. Storage device controller 118 can be implemented on the same circuit board or device as the memory chips 116 or on a different circuit board or device. For example, in some environments, storage device controller 118 may be a centralized storage controller that manages memory operations for multiple different storage devices 106 of computer system 100.

In various embodiments, the storage device 106 also includes program control logic 124 which is operable to control the programming sequence performed when data is written to or read from a memory chip 116. In various embodiments, program control logic 124 may provide the various voltages (or information indicating which voltages should be provided) that are applied to memory cells during the programming and/or reading of data (or perform other operations associated with read or program operations), perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 described herein may be located on a memory chip 116. In various embodiments, reference herein to a "controller" may refer to any suitable control logic, such as storage device controller 118, chip controller 126, or a partition controller. In some embodiments, reference to a controller may contemplate logic distributed on multiple components, such as logic of a storage device controller 118, chip controller 126, and/or a partition controller.

In various embodiments, storage device controller 118 may receive a command from a host device (e.g., CPU 102), determine a target memory chip for the command, and communicate the command to a chip controller 126 of the target memory chip. In some embodiments, the storage device controller 118 may modify the command before sending the command to the chip controller 126.

In various embodiments, the storage device controller 118 may send commands to memory chips 116 to perform host-initiated read operations as well as device-initiated read operations. A host-initiated read operation may be performed in response to reception of a read command from a host coupled to the storage device 106, such as CPU 102. A device-initiated read operation may be a read operation that is performed in response to a device-initiated read command generated by the storage device 106 independent of receiving a read command from the host. In various embodiments, the storage device controller 118 may be the component that generates device-initiated read commands. The storage device 106 may initiate a device-initiated read command for any suitable reason. For example, upon power up of a storage device, the storage device 106 may initiate a plurality of read and write-back commands to re-initialize data of the storage device 106 (e.g., to account for any drift that has occurred while the storage device 106 or a portion thereof was powered off or has sat idle for a long period of time).

The chip controller 126 may receive a command from the storage device controller 118 and determine a target memory partition 122 for the command. The chip controller 126 may then send the command to a controller of the determined memory partition 122. In various embodiments, the chip controller 126 may modify the command before sending the command to the controller of the partition 122.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (e.g., on-chip) or package or any of the elements of CPU 102 may be located off-chip or off-package. Similarly, the elements depicted in storage device 106 may be located on a single chip or on multiple chips. In various embodiments, a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Storage device SRAM 130 and chip SRAM 128 each are adapted to execute internal firmware or software of the storage device 106 and memory chip 116 respectively. For example, the logic to be implemented by program control logic 124, upon the issuance of a command, for example from the host or CPU 102 to execute the logic, may be moved from a memory storing the logic to SRAM 130 (such as a NVM—not shown) such that the logic may be executed by the storage device controller 118 which will have access to the logic instructions by way of the associated SRAM 128. Similarly, the logic to be implemented by the chip controller 126, upon the issuance of a command, for example from the host or CPU 102 to execute the logic, may be moved from a memory storage the logic to the associated SRAM 128 (such as a NVM—not shown) such that the logic may be executed by the associated chip controller 126 which will have access to the logic instructions by way of the associated SRAM 128.

Figure 2:
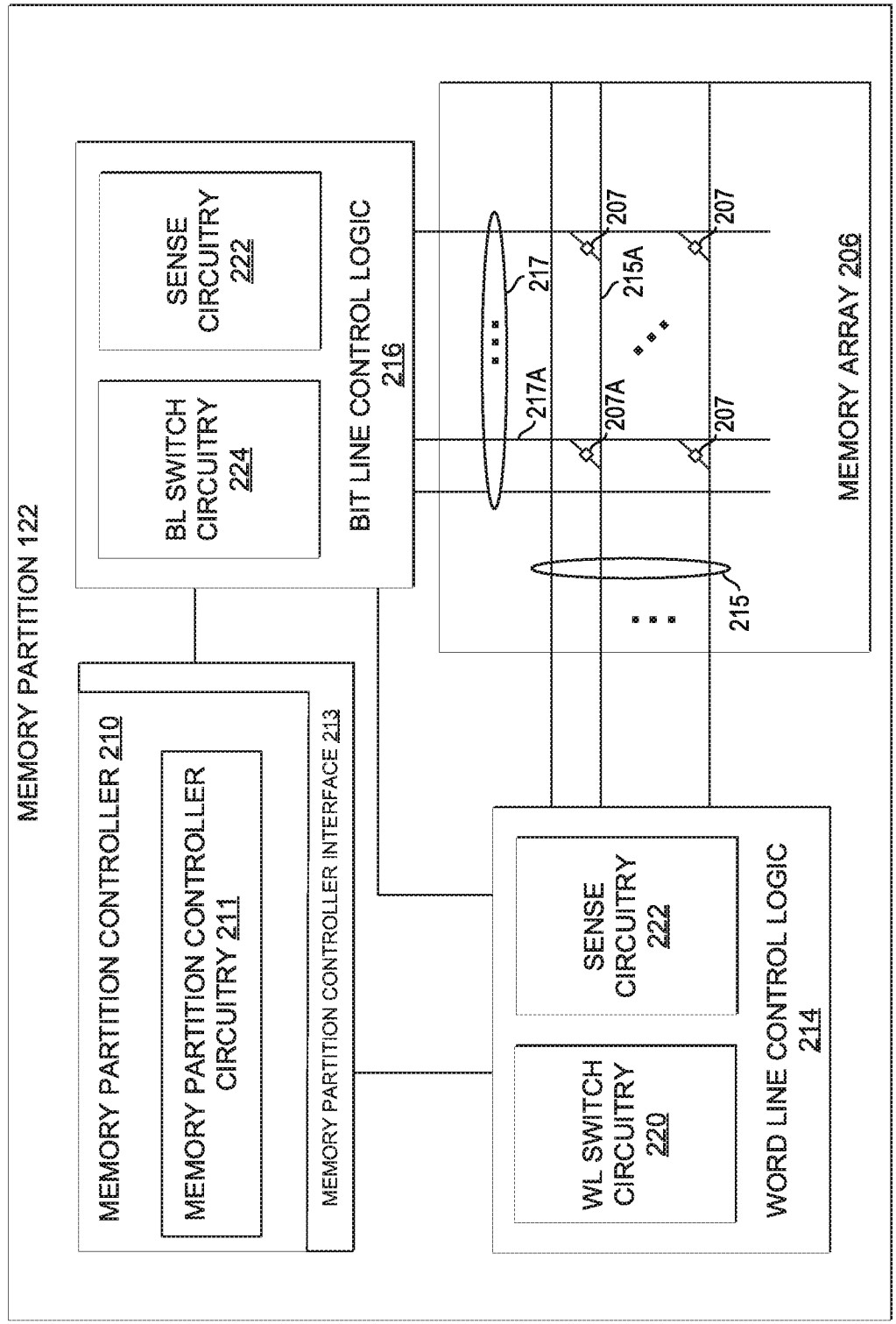
FIG. 2 is a schematic illustration of a memory partition in accordance with certain embodiments.

FIG. 2 illustrates a detailed exemplary view of the memory partition 122 of FIG. 1 in accordance with certain embodiments. In one embodiment, a memory partition 122 may include 3D crosspoint memory which may include phase change memory or other suitable memory types. In a particular embodiment, phase change memory may utilize a chalcogenide material for memory elements. A memory element is a unit of a memory cell that actually stores the information. In operation, phase change memory may store information on the memory element by changing the phase of the memory element between amorphous and crystalline phases. The material of a memory element (e.g., the chalcogenide material) may exhibit either a crystalline or an amorphous phase, exhibiting a low or high conductivity. Generally, the amorphous phase has a low conductivity (high impedance) and is associated with a reset state (logic zero) and the crystalline phase has a high conductivity (low impedance) and is associated with a set state (logic one). The memory element may be included in a memory cell 207 (e.g., a phase change memory cell) that also includes a selector, e.g., a select device coupled to the memory element. The select devices are configured to facilitate combining a plurality of memory elements into an array.

In some embodiments, a 3D crosspoint memory array 206 may comprise a transistor-less (e.g., at least with respect to the data storage elements of the memory) stackable crosspoint architecture in which memory cells 207 sit at the intersection of row address lines and column address lines arranged in a grid. The row address lines 215 and column address lines 217, called word lines (WLs) and bit lines (BLs), respectively, cross in the formation of the grid and each memory cell 207 is coupled between a WL and a BL where the WL and BL cross (e.g., at a crosspoint). At the point of a crossing, the WL and BL may be located at different vertical planes such that the WL crosses over the BL but does not physically touch the BL. As described above, the architecture may be stackable, such that a word line may cross over a bit line located beneath the word line and another bit line for another memory cell located above the word line. It should be noted that row and column are terms of convenience used to provide a qualitative description of the arrangement of WLs and BLs in crosspoint memory. In various embodiments, the cells of the 3D crosspoint memory array may be individually addressable. In some embodiments, bit storage may be based on a change in bulk resistance of a 3D crosspoint memory cell. In various embodiments, 3D crosspoint memory may include any of the characteristics of 3D XPoint memory manufactured by INTEL CORPORATION and/or MICRON TECHNOLOGY, INC.

During a programming operation (e.g., a write operation), the phase of the memory element may be changed by the application of a first bias voltage to the WL and a second bias voltage to the BL resulting in a differential bias voltage across the memory cell that may cause a current to flow in the memory element. The differential bias voltage may be maintained across the memory cell for a time period sufficient to cause the memory element to "snap back" and to transition the memory element from the amorphous state to the crystalline state or from the crystalline state to the amorphous state (e.g., via the application of heat produced by an electric current). Snap back is a property of the composite memory element that results in an abrupt change in conductivity and an associated abrupt change in the voltage across the memory element.

In a read operation, a target memory cell is selected via the application of a first bias voltage to the selected WL and a second bias voltage to the selected BL that cross at the target memory cell for a time interval. A resulting differential bias voltage (a demarcation read voltage (VDM)) across the memory element is configured to be greater than a maximum set voltage and less than a minimum reset voltage for the memory element. Selection of the selected WL and selected BL and application of the first bias and second bias voltage may be implemented by a decoder in a switch circuitry, such as WL switch circuitry 220 and BL switch circuitry 240. In response to application of the VDM, the target memory element may or may not snap back, depending on whether the memory element is in the crystalline state (set) or the amorphous state (reset). Sense circuitry, coupled to the memory element, is configured to detect the presence or absence of snap back in a sensing time interval. The presence of snap back may then be interpreted as a logic one and the absence of snap back as a logic zero.

The differential bias at which a memory cell transitions from being sensed as a logic one (e.g., due to the memory cell snapping back) to being sensed as a logic zero (e.g., due to the memory cell not snapping back), may be termed a threshold voltage (sometimes referred to as a snap back voltage). Thus, when the VDM is higher than the threshold voltage of the memory cell, the memory cell may be sensed as storing a logic one and when the VDM is lower than the threshold voltage of the memory cell, the memory cell may be sensed as storing a logic zero.

In some embodiments, an applied bias such as the VDM of a read pulse may be high enough to only turn on 3D crosspoint cells in the crystalline state, which may have a lower threshold voltage than 3D crosspoint cells in the amorphous state. In some embodiments, the VDM may be supplied through negative and/or positive regulated nodes. For example, the bitline electrode of the 3D crosspoint cell may be a positive regulated node and the wordline electrode coupled to the cell may supply the bias for VDM.

For a write operation or a read operation, one memory cell 207A out of many cells, such as thousands of cells, may be selected as the target cell for the read or write operation, the cell being at the cross section of a BL 217A and a WL 215A. All cells coupled to BL 217A and all cells coupled to WL 215A other than cell 207A may still receive a portion of VDM (e.g., approximately ½ of VDM), with only cell 207A receiving the full VDM.

In the embodiment of FIG. 2, a memory partition 122 includes memory partition controller 210, word line control logic 214, bit line control logic 216, and memory array 206. A host device (e.g., CPU 102) may provide read and/or write commands including memory address(es) and/or associated data to memory partition 122 (e.g., via storage device controller 118 and chip controller 126) and may receive read data from memory partition 122 (e.g., via the chip controller 126 and storage device controller 118). Similarly, storage device controller 118 may provide host-initiated read and write commands or device-initiated read and write commands including memory addresses to memory partition 122 (e.g., via chip controller 126). Memory partition controller 210 (in conjunction with word line control logic 214 and bit line control logic 216) is configured to perform memory access operations, e.g., reading one or more target memory cells and/or writing to one or more target memory cells.

Memory array 206 corresponds to at least a portion of a 3D crosspoint memory (e.g., that may include phase change memory cells or other suitable memory cells) and includes a plurality of word lines 215, a plurality of bit lines 217 and a plurality of memory cells, e.g., memory cells 207. Each memory cell is coupled between a word line ("WL") and a bit line ("BL") at a crosspoint of the WL and the BL. Each memory cell includes a memory element configured to store information and may include a memory cell select device (e.g., selector) coupled to the memory element. Select devices may include ovonic threshold switches, diodes, bipolar junction transistors, field-effect transistors, etc. Memory array 206 may be configured to store binary data and may be written to (e.g., programmed) or read from.

Memory partition controller 210 may manage communications with chip controller 126 and/or storage device controller 118. In a particular embodiment, memory partition controller 210 may analyze one or more signals received from another controller to determine whether a command sent via a bus is to be consumed by the memory partition 122. For example, controller 210 may analyze an address of the command and/or a value on an enable signal line to determine whether the command applies to the memory partition 122. Controller 210 may be configured to identify one or more target WLs and/or BLs associated with a received memory address (this memory address may be a separate address from the memory partition address that identifies the memory partition 122, although in some embodiments a portion of an address field of a command may identify the memory partition while another portion of the address field may identify one or more WLs and/or BLs). Memory partition controller 210 may be configured to manage operations of WL control logic 214 and BL control logic 216 based, at least in part, on WL and/or BL identifiers included in a received command. Memory partition controller 210 may include memory partition controller circuitry 211, and a memory controller interface 213. Memory controller interface 213, although shown as a single block in FIG. 2, may include a plurality of interfaces, for example a separate interface for each of the WL control logic 214 and the BL control logic 216.

WL control logic 214 includes WL switch circuitry 220 and sense circuitry 222. WL control logic 214 is configured to receive target WL address(es) from memory partition controller 210 and to select one or more WLs for reading and/or writing operations. For example, WL control logic 214 may be configured to select a target WL by coupling a WL select bias voltage to the target WL. WL control logic 214 may be configured to deselect a WL by decoupling the target WL from the WL select bias voltage and/or by coupling a WL deselect bias voltage to the WL. WL control logic 214 may be coupled to a plurality of WLs 215 included in memory array 206. Each WL may be coupled to a number of memory cells corresponding to a number of BLs 217. WL switch circuitry 220 may include a plurality of switches, each switch configured to couple (or decouple) a respective WL, e.g., WL 215A, to a WL select bias voltage to select the respective WL 215A. For example, WL switch circuitry 220 may include a plurality of switches that each correspond to a particular WL. In one embodiment, each switch includes a pair of metal oxide semiconductor field effect transistors (MOSFETs) comprising a positive-type (p-type) metal oxide semiconductor transistor (PMOS) and a negative-type (n-type) MOS transistor (NMOS). The pair may form a complementary MOS circuit (CMOS).

BL control logic 216 includes BL switch circuitry 224. In some embodiments, BL control logic 216 may also include sense circuitry, e.g., sense circuitry 222. BL control logic 216 is configured to select one or more BLs for reading and/or writing operations. BL control logic 216 may be configured to select a target BL by coupling a BL select bias voltage to the target BL. BL control logic 216 may be configured to deselect a BL by decoupling the target BL from the BL select bias voltage and/or by coupling a BL deselect bias voltage to the BL. BL switch circuitry 224 is similar to WL switch circuitry 220 except BL switch circuitry 224 is configured to couple the BL select bias voltage to a target BL.

Sense circuitry 222 is configured to detect the state of one or more sensed memory cells 207 (e.g., via the presence or absence of a snap back event during a sense interval), e.g., during a read operation. Sense circuitry 222 is configured to provide a logic level output related to the result of the read operation to, e.g., memory partition controller 210. For example, a logic level corresponding to a logic one may be output if the applied VDM is higher than the memory cell's threshold voltage or a logic zero if the applied VDM is lower than the memory cell's threshold voltage. In a particular embodiment, a logic one may be output if a snap back is detected and a logic zero may be output if a snap back is not detected.

As an example, in response to a signal from memory partition controller 210, WL control logic 214 and BL control logic 216 may be configured to select a target memory cell, e.g., memory cell 207A, for a read operation by coupling WL 215A to WL select bias voltage and BL 217A to BL select bias voltage as well as coupling the other WLs and BLs to respective deselect bias voltages. One or both of sense circuitries 222 may then be configured to monitor WL 215A and/or BL 217A for a sensing interval in order to determine the state of the memory cell 207A (e.g., to determine whether or not a snap back event occurs). For example, if a sense circuitry 222 detects a snap back event, then memory cell 207A may be in the set state, but if a sense circuitry 222 does not detect a snap back event in the sensing interval, then memory cell 207A may be in the reset state.

Thus, WL control logic 214 and/or BL control logic 216 may be configured to select a target memory cell for a read operation, initiate the read operation, sense the selected memory cell (e.g., for a snap back event) in a sensing interval, and provide the result of the sensing to, e.g., memory partition controller 210.

In a particular embodiment, the sense circuitry 222 may include a WL load connected to a WL electrode or gate, and a BL load connected to a BL electrode or gate. When a particular wordline and bitline are selected in the array, a difference between WL load or WL voltage and the BL voltage corresponds to a read VDM. VDM may induce a current (icell) in the memory cell 207A. A comparator such as a sense amplifier may compare icell with a reference current in order to read a logic state one or logic state zero depending on whether the memory cell is a set cell or a reset cell. The reference current may thus be selected such that the current of the target memory cell is lower than the reference current before snapback of the target memory cell and higher than the reference current after snapback of the target memory cell. In this manner, an output of the sense amplifier/comparator may be indicative of a state of the target memory cell. A latch may be coupled to the output of the comparator to store the output of the read operation.

For each matrix of arrays, there may be a number of sense amplifiers provided, with the sense circuitry 222 able to process up to a maximum number of sensed bits, such as 128 bits, from the sense amplifiers at one time. Hence, 128 memory cells may be sensed at one time by sense amplifiers of the sense circuitry 222.

Figure 3:
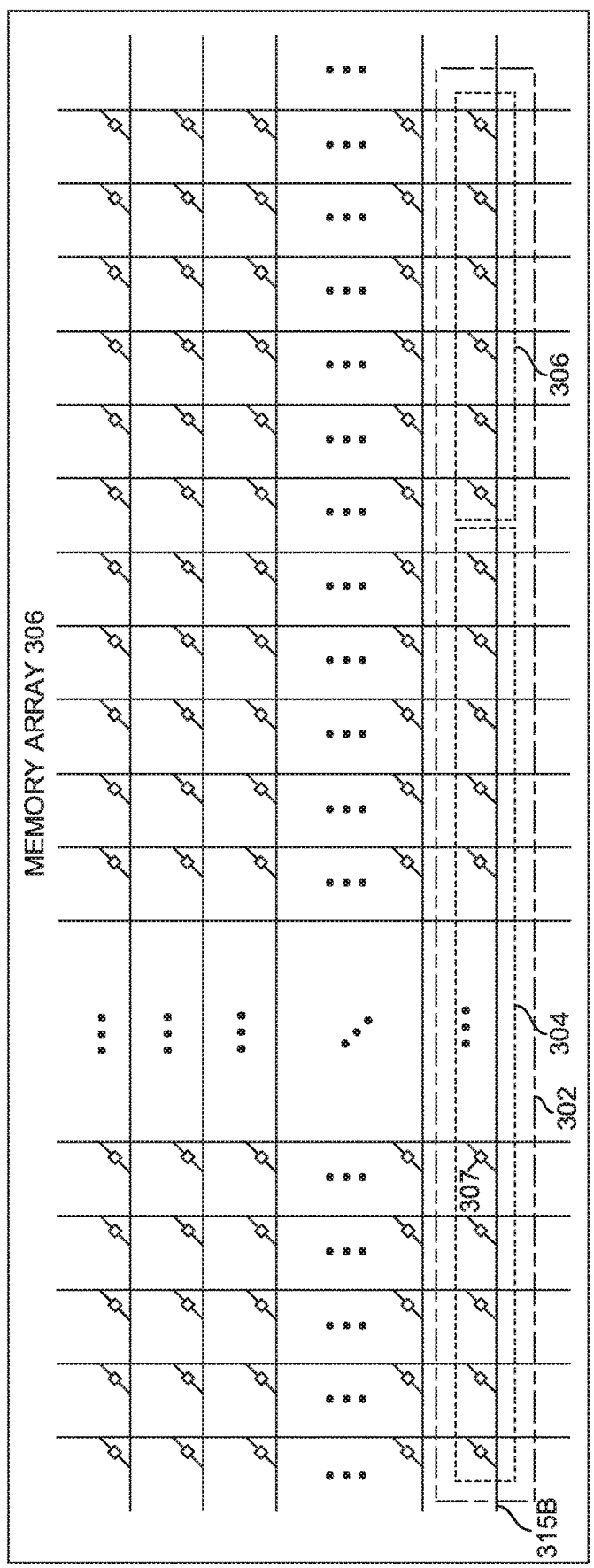
FIG. 3 is a schematic illustration of a memory array in accordance with certain embodiments.

FIG. 3 illustrates a detailed exemplary view of the memory array 206 of FIG. 2 in accordance with certain embodiments. In various embodiments, a plurality of memory cells 207 of memory array 206 may be divided into a logical group such as a slice 302 (and the memory array 206 may include a plurality of slices). In the embodiment depicted, slice 302 includes a plurality of memory cells 207 coupled to the same WL 215A, though a slice 302 may comprise any suitable arrangement of memory cells.

In a particular embodiment, a slice may include a payload portion 304 and a metadata portion 306. The memory cells of the payload portion 304 may store data written to the storage device 106 by a host (e.g., CPU 102/104). For example, the host may send a write command specifying payload data to be written to the storage device 106 at a particular logical address. The payload of the write command may be stored in a payload portion 304 of one or more slices 302 (in various embodiments, the payload portion 304 may be large enough to hold payload data from multiple write commands from the host). In various embodiments, the size of the payload portion of a slice may have any suitable size, such as 1 kibibyte (KiB), 2 KiB, 4 KiB, 8 KiB, or other suitable size.

The memory cells of the metadata portion 306 of a slice 302 may store metadata associated with the payload data stored in the payload portion 304 of the slice 302 or the slice itself. The metadata portion 306 may store any suitable metadata associated with the payload data or slice. For example, the metadata portion 306 may store parity bits and/or cyclic redundancy check (CRC) bits used during error detection and error correction, e.g., by the storage device controller 118. In alternative embodiments, error detection and/or correction may be performed at any suitable level on the storage device 106, such as by the chip controllers 126 or partition controllers.

Figure 4:
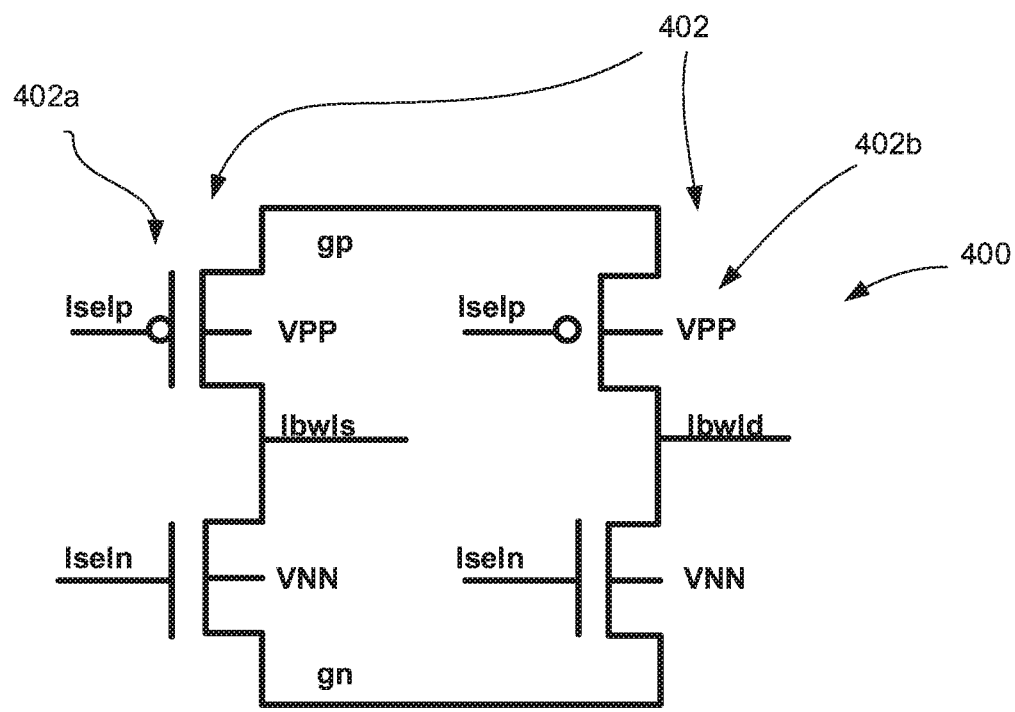
FIG. 4 is a schematic illustration of a portion of a decoder circuitry for address lines in a 3D crosspoint memory architecture.

Reference is now made to FIGS. 4-6 which respectively show a decoder portion 400 where the decoder portions may be part of decoders of switch circuitries 220 or 240 of FIG. 2.

Reference is now made to FIG. 4, which shows a portion 400 of a decoder circuitry (or decoder) architecture, including two pairs of identical switches 402, that is, switches 402a and 402b, with switch 402a in the shown figures herein to be used, when needed, for a selected address line (either a WL or a BL) and 402b for a deselected address line (again, either a WL or a BL). In various embodiments (although not shown), additional switches 402 is in fact repeated for all address lines of a particular type (that is, of either the WL type or of the BL type), such that there is a switch for each address line (WL or BL) in a given memory array.

A bipolar decoder (a portion 400 of which is shown in FIG. 4 and in subsequent figures) may according to some embodiments be used for WLs only, or for BLs only. Thus, switch circuitries 220 (WL switch circuitry) and 224 (BL switch circuitry) may each include a dedicated decoder circuitry (e.g., one for WL switch circuitry 220 and one for BL switch circuitry 224) that operates on, respectively, all the WLs (for WL switch circuitry 220) and the BLs (for BL switch circuitry 240). Thus, in the instant description a reference to address lines or lbwl of a given decoder or a given decoder portion in the context of a description of a decoder circuitry herein may refer to either address lines that include only WLs or to address lines that include only BLs for that given decoder being described, and not both WLs and BLs for the same decoder being described.

Referring still to FIG. 4, each switch includes a PMOS/NMOS pair and may be coupled to its address line (hereinafter "lbwl"), which may include a WL or a BL, in one embodiment—such as one of WLs 215 or BLs 217 of FIG. 2, at a common drain node of the PMOS and NMOS of the pair. The PMOS may be connected to a positive supply gp at a source thereof, and the NMOS may be connected to a negative supply gn at a source thereof. The supply voltages gp and gn may be coupled to multiple ones of the switches and may therefore be common between the switches for a given address line type (WL or BL). Each PMOS and each NMOS may be biased at a gate thereof (hereinafter "lsel", with "lselp" referring to the gate of the PMOS and "lseln" referring to the gate of the NMOS). Turning the PMOS on would supply a positive bias to lbwl, and turning the NMOS on would supply a negative bias to lbwl. Since an address line lbwl may be biased either positively or negatively, the decoder may be referred to as a bipolar decoder or a bipolar multiplexer, either a row multiplexer or "ROWMUX" where lbwl corresponds to a WL, or a column multiplexer or "COLMUX" where lbwl corresponds to a BL.

The terms positive and negative as used herein to modify the term voltage, may refer to the relative magnitudes and signs of the voltages. Thus, these terms may, but do not necessarily, refer only to the actual sign of the voltage. As used herein when referring to a positive voltage and a corresponding negative voltage, the positive voltage is merely higher in value than a corresponding negative voltage. For example, a first positive voltage may be +5 volts and a corresponding first negative voltage may be −5 volts. Alternatively, a second positive voltage may be +10 volts and a corresponding second negative voltage may be 0 volts. As yet another alternative, a third positive voltage may be +15 volts while a corresponding third negative voltage may be +5 volts.

The decoder portion 400 of FIG. 4 includes switches including four terminal transistors comprising sources (connected to gp and gn respectively for the PMOS and the NMOS), drains (including a common drain coupled to lbwl), gates (lselp and lseln) and body biases (bb). The body bias for each PMOS is biased to VPP and for each NMOS is biased to VNN regardless of whether the switch is in an idle state (to be explained below), positive bias to the selected address line, or at negative bias to the selected address line.

The nodes (gp, lselp, lseln, gn, and, consequently, the address lines lbwl) of a decoder circuitry a portion 400 of which is shown in FIG. 4 may be driven to various biases for example by a memory controller on a memory partition, such as, for example, memory partition controller 210 of memory partition 122 of FIG. 2, which memory partition controller 210 may, as noted above, be configured to manage operations of WL control logic 214 and BL control logic 216 based, at least in part, on WL and/or BL identifiers included in a received memory operation command. The WL control logic 214 and BL control logic 216 may include, respectively a WL switch circuitry 220 and a BL switch circuitry 240, each of which may include a decoder circuitry a portion 400 of which is depicted by way of example in FIGS. 4, 5A-5C, and 6A-6E.

Referring still to FIG. 4, in order to select an address line lbwl (hereinafter "lbwls" referring to a selected WL or a selected BL), the associated switch is used to turn on either the PMOS or the NMOS for, respectively, a positive bias and a negative bias to lbwls. The switching of the lbwls to a positive bias may involve the biasing, for example in all switches 402b, of the associated NMOS gate lselns to a different value than at its idle state, and the switching of the lbwls to a negative bias may involve the biasing of the associated PMOS gate lselps to a different value than at its idle state.

The turning on or off of a MOSFET within a memory decoder switch thus typically occurs by changing one or more node biases for the switch starting from an idle bias at the one or more node. In addition to selecting an address line for biasing for a memory cell operation as noted above, each of the remaining switches for the unselected address lines lbwl (hereinafter "lbwld") may have a bias of a MOS transistor gate thereof changed with respect to an idle bias of that gate in order to implement deselection of that address line. Thus, referring still to FIG. 4, where lbwls is to be biased to a positive or negative bias for selection, all remaining address lines, that is, all lbwld's (only one of which is shown) are to remain biased to VSS (0V or reference ground) for deselection as compared with their bias at idle state. In order for all lbwld's to remain at VSS with respect to their bias at idle state, the gate of the PMOS for each lbwld (hereinafter "lselpd") or the gate of the NMOS for each lbwld (hereinafter "lselnd") may have its bias changed with respect to idle, depending on whether, respectively, lbwls is to be biased to a positive voltage or a negative voltage.

However, disadvantageously, since there are m address lines for every one selected address line (for an array of m+1 address lines, such as m+1 WLs and/or m+1 BLs), the gate bias change for MOS transistors of deselected address lines would occur m times, in this way significantly increasing the energy expenditure of address line selection in 3D crosspoint devices.

Reference in this context is now made to Table 1 below, which shows biases at each of gp, lselp, lbwl, lseln, and gn as shown for the bipolar decoder of FIG. 4 for each of a positively biased selected lbwl, a negatively biased selected lbwl and an idle state for the address lines. It is noted that, for a memory operation to take place, the decoder nodes are to be initialized to an idle state before a selection or deselection takes place. The change in bias for each node is therefore based on a change from the bias value at the idle state, which provides a known neutral value for each node based on which the decoder switches may implement a bias change to that node. Keeping the above in mind, as is clear from Table 1 below, a selection of a lbwl for biasing to either a positive bias or a negative bias in any event entails the change of bias values of, respectively, all PMOS gates or all NMOS gates for each remaining/deselected lbwld, as indicated for deselected line biases marked in bold and italics in Table 1 below. Referring again to FIG. 4 in the context of Table 1, and looking at the gn/gp node bias states, we would need to toggle a number m of deselected gates to block shorts between gn/gp and clearly bias the deselected address lines to VSS as desired.

TABLE 1

Current Art Bipolar Decoder Node Biases

| | CURRENT ART BIPOLAR | | | | |
|---|---|---|---|---|---|
| | POS | | NEG | | |
| | SEL | DESEL | SEL | DESEL | IDLE |
| gp | VPPs | VPPs | VSS | VSS | VSS |
| lselp | VEE | VPPs | VSS | VEE | VEE |
| lbwl | VPPs | VSS | VNNs | VSS | VSS |
| lseln | VSS | VCC | VCC | VNNs | VCC |
| gn | VSS | VSS | VNNs | VNNs | VSS |
| #/patch | 1 | m | 1 | m | m + 1 |

In Table 1, and as used herein, VPP is the high positive bias; VNN is the high negative bias; VPPs is high positive selection bias up to VPP; VNNs is high negative selection bias up to VNN; VCC is low positive bias supply; VEE is low negative bias supply; VSS is 0V or reference ground; and m is the number of deselected decoders for every selected decoder with m>>1. The number m+1 may for example be in the order of tens, hundreds, thousands. The $CV^2$ energy cost of addressing current art decoders is quite high as a result of the large number of deselected gates to toggle, as we would need to change m+1 decoder gates every time we address the decoder from idle to positive or idle to negative).

Figure 5A:
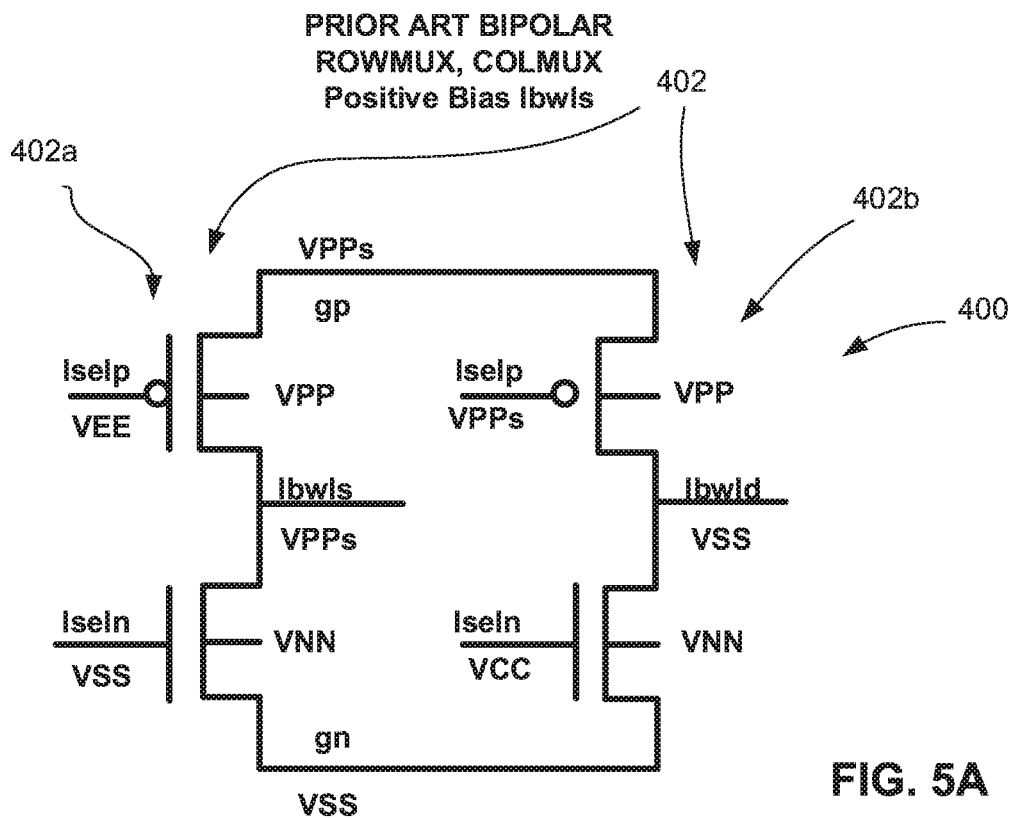
FIG. 5A is a schematic illustration of the portion of the decoder circuitry of FIG. 4, showing nodes of the decoder circuitry biased according to the state of the art to bias the address line to a positive voltage.
Figure 5B:
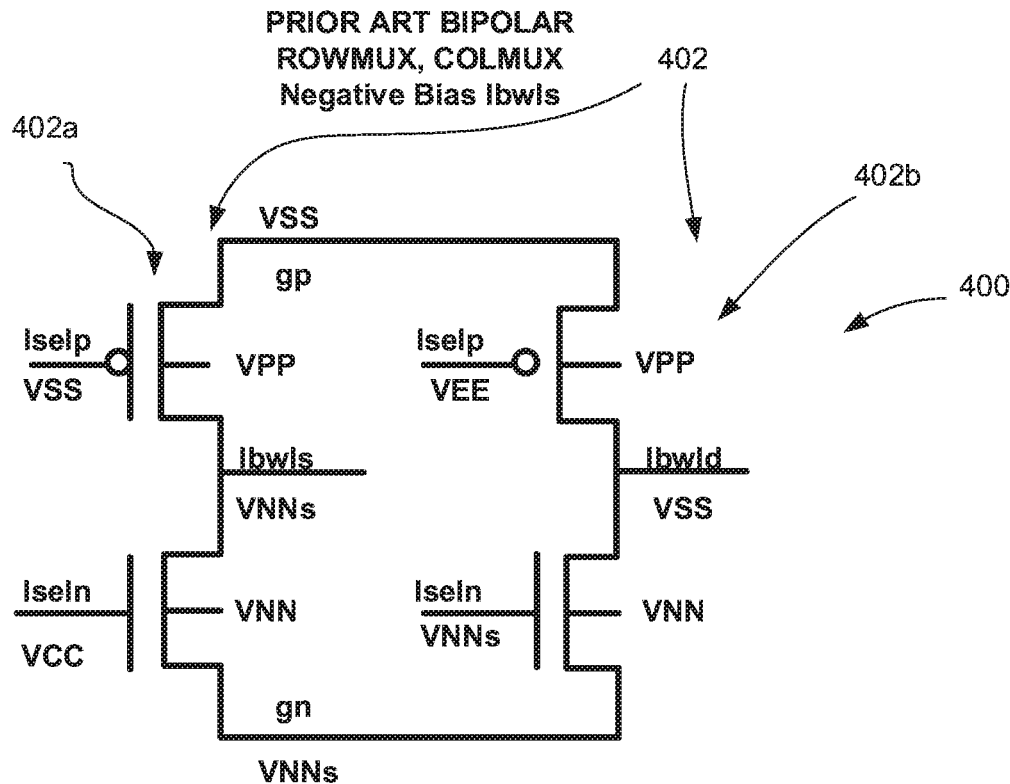
FIG. 5B is a schematic illustration of the portion of the decoder circuitry of FIG. 4, showing nodes of the decoder circuitry biased according to the state of the art to bias the address line to a negative voltage.
Figure 5C:
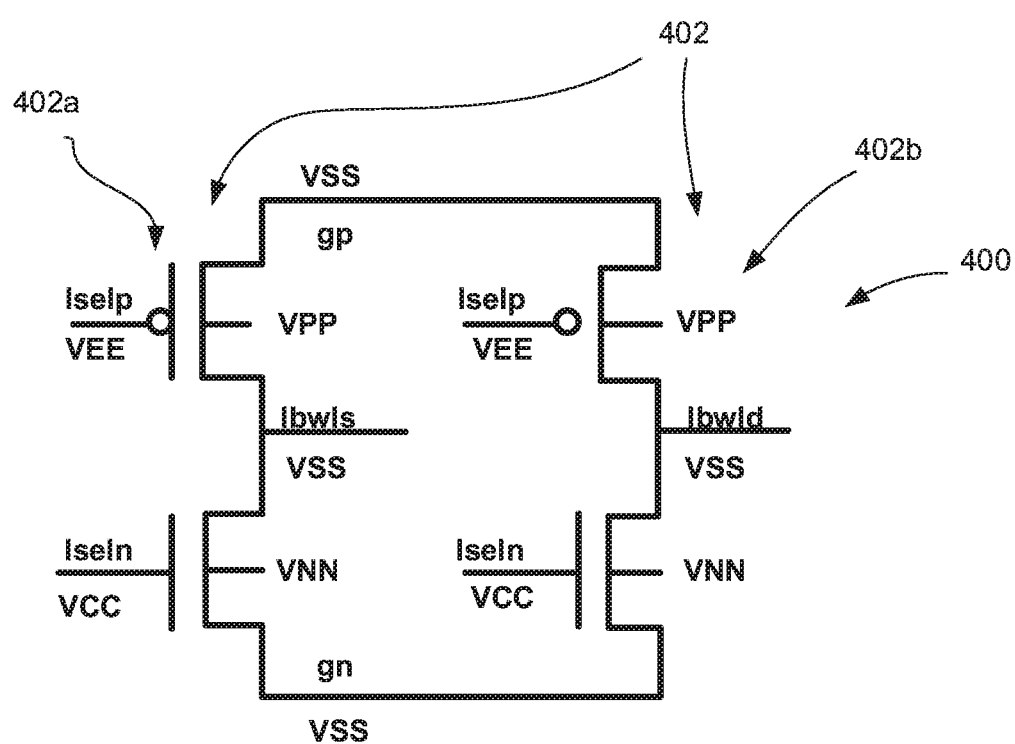
FIG. 5C is a schematic illustration of the portion of the decoder circuitry of FIG. 4, showing nodes of the decoder circuitry biased according to the state of the art to bias all address lines to VSS to achieve an idle state for the decoder circuitry.

Reference is now made to FIGS. 5A, 5B and 5C, which show the portion 400 of the decoder of FIG. 4 showing nodes of the decoder circuitry biased according to the column biases shown in Table 1 above.

FIG. 5A depicts the portion of the decoder circuitry of FIG. 4, showing nodes of the decoder circuitry biased according to the state of the art to bias the selected address line to a positive voltage. The node biases shown in FIG. 5A correspond to the node biases shown for each of the same nodes in Table 1 above under the "POS" or positive column.

FIG. 5B depicts the portion of the decoder circuitry of FIG. 4, showing nodes of the decoder circuitry biased according to the state of the art to bias the selected address line to a negative voltage. The node biases shown in FIG. 5B correspond to the node biases shown for each of the same nodes in Table 1 above under the "NEG" or negative column.

FIG. 5C depicts the portion of the decoder circuitry of FIG. 4, showing nodes of the decoder circuitry biased according to the state of the art to bias all address lines to a known voltage to achieve an idle state, where in the shown case, the known voltage is VSS. The node biases shown in FIG. 5C correspond to the node biases shown for each of the same nodes in Table 1 above under the "IDLE" column.

According to some embodiments, an apparatus includes memory controller circuitry (such as, by way of example only, memory partition controller circuitry 211); and a memory controller interface (such as, by way of example only, memory partition interface 213) coupled to the memory controller circuitry and adapted to couple the memory controller circuitry to a decoder circuitry of a memory array, the memory array including address lines comprising wordlines (WLs) and bitlines (BLs), and the decoder circuitry including a plurality of switches coupled respectively to the WLs, or respectively to the BLs. The memory controller circuitry is to control the decoder circuitry by causing a selected switch of the plurality of switches to change a bias of a corresponding selected address line coupled thereto from a floating bias at an idle state of the decoder circuitry to either a positive bias or a negative bias without changing a bias at deselected address lines corresponding to deselected switches of the plurality of switches from the floating bias at the idle state. Thus, according to some embodiments, the memory controller circuitry does not change a bias of the plurality of deselected address lines when going from the idle state to either the positive state of the selected address line or to the negative state of the selected address line. In this way, the energy required to address memory cells in a memory array, such as a memory array of a 3D crosspoint architecture, is substantially reduced, and performance therefore improved.

Figure 6A:
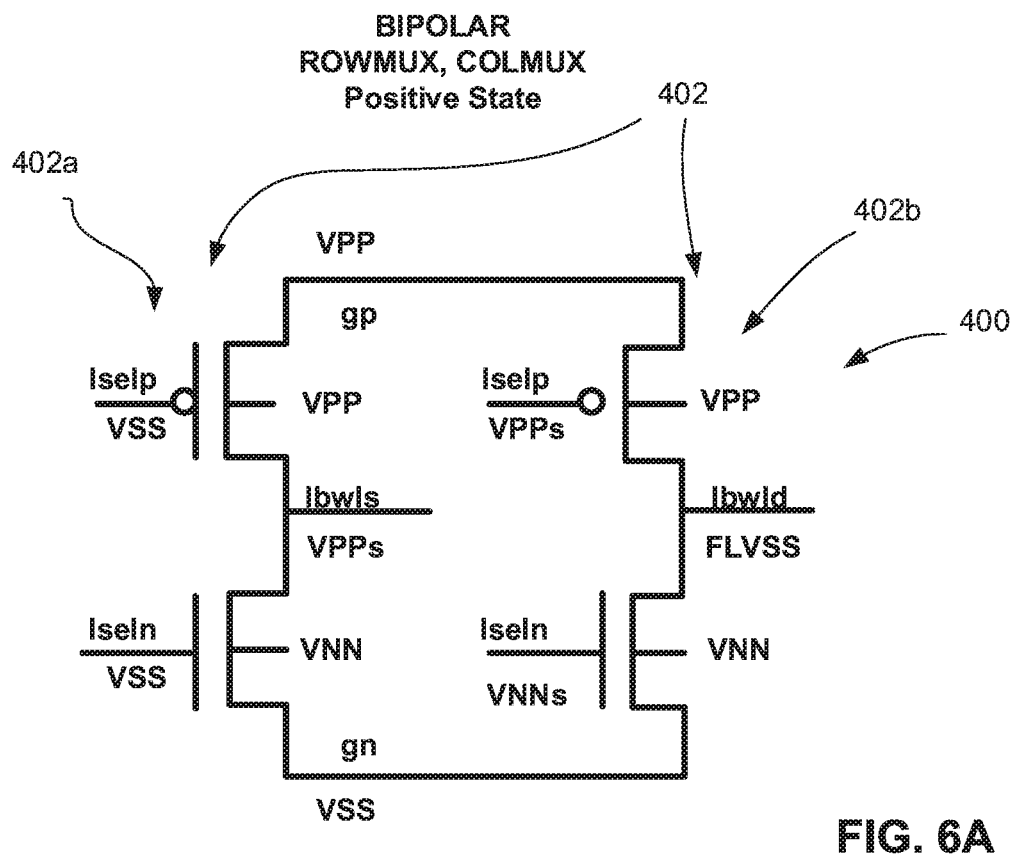
FIG. 6A is a schematic illustration of the portion of the decoder circuitry of FIG. 4, showing nodes of the decoder circuitry biased according to some embodiments to bias the selected address line to a positive voltage.
Figure 6B:
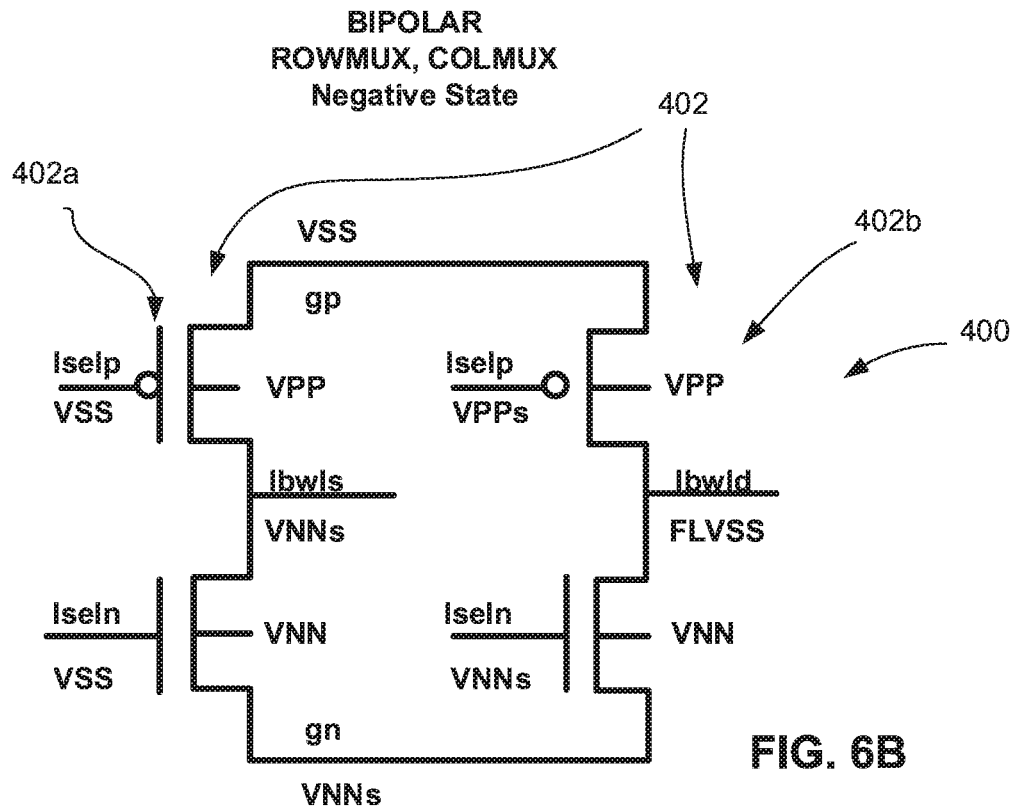
FIG. 6B is a schematic illustration of the portion of the decoder circuitry of FIG. 4, showing nodes of the decoder circuitry biased according to some embodiments to bias the selected address line to a negative voltage.
Figure 6C:
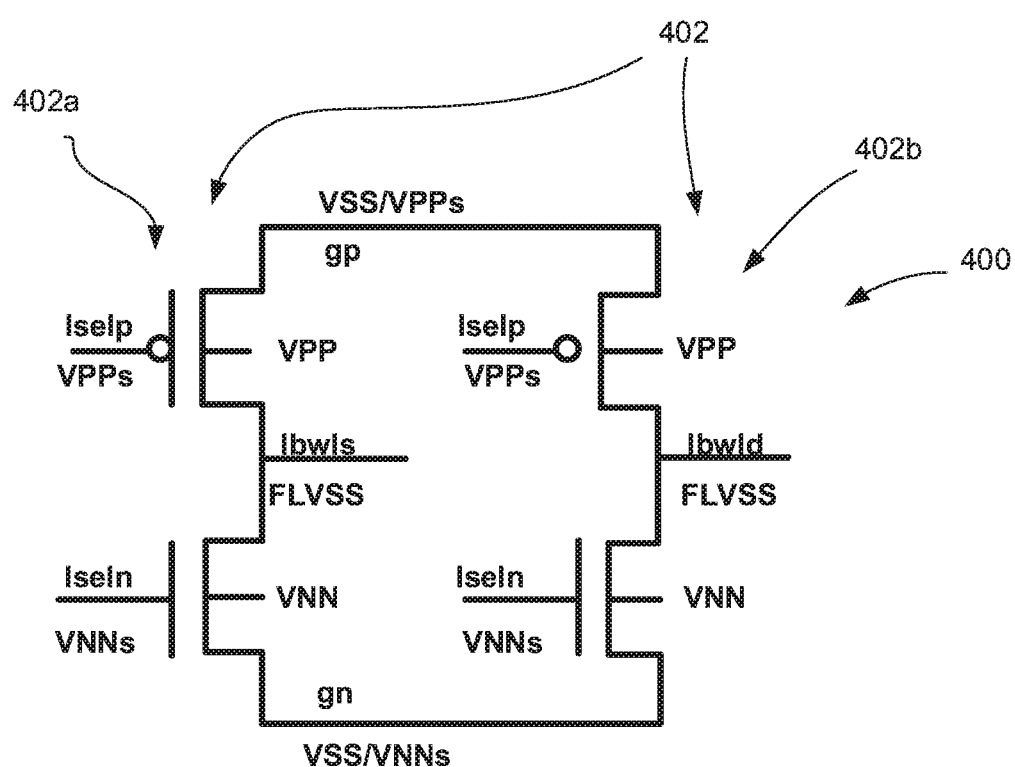
FIG. 6C is a schematic illustration of the portion of the decoder circuitry of FIG. 4, showing nodes of the decoder circuitry biased according to some embodiments to bias all address lines to VSS to achieve an idle state for the decoder circuitry.

Reference is now made to FIGS. 6A, 6B and 6C, which show the portion 400 of the decoder of FIG. 4 with nodes of the decoder circuitry biased in order to achieve, respectively, a positive biasing of lbwls, a negative biasing of lbwls and an idle state for the decoder, according to some embodiments as shown by way of the indicated corresponding column biases in Table 2 below. What is meant in referring to the same decoder portion 400 as that in FIG. 4 (the state of the art) is to convey that some embodiments may be implemented by driving the nodes of a known decoder using bias voltages in a new and useful manner as will be depicted below. Thus, some embodiments do not necessitate decoder circuitry hardware changes.

FIG. 6A depicts the portion of the decoder circuitry of FIG. 4, showing nodes of the decoder circuitry biased according to some embodiments to bias the address line to a positive voltage. The node biases shown in FIG. 6A correspond to the node biases shown for each of the same nodes in Table 2 below under the "POS" or positive column.

FIG. 6B depicts the portion of the decoder circuitry of FIG. 4, showing nodes of the decoder circuitry biased according to some embodiments to bias the selected address line to a negative voltage. The node biases shown in FIG. 5B correspond to the node biases shown for each of the same nodes in Table 1 above under the "NEG" or negative column.

FIG. 6C depicts the portion of the decoder circuitry of FIG. 4, showing nodes of the decoder circuitry biased according to the state of the art to bias all address lines to a known voltage to achieve an idle state, where in the shown case, the known voltage is a floating VSS or FLVSS. The node biases shown in FIG. 6C correspond to the node biases shown for each of the same nodes in Table 1 above under the "IDLE" column. In the context of Table 2, the columns pertaining to a positive refresh state "REF+" and to a negative refresh state "REF-" will be addressed further below in the instant description.

TABLE 2

Bipolar Decoder Node Biases According to some Embodiments

| | SOME EMBODIMENTS | | | | | | |
|---|---|---|---|---|---|---|---|
| | POS | | NEG | | | | |
| | SEL | DESEL | SEL | DESEL | IDLE | REF+ | REF− |
| gp | VPPs | VPPs | VSS | VSS | VSS/VPPs | VPPs | VSS |
| lselp | VSS | *VPPs* | VSS | *VPPs* | *VPPs* | VPPs | VEE |
| lbwl | VPPs | FL VSS | VNNs | FL VSS | FL VSS | VSS | VSS |
| lseln | VSS | *VNNs* | VSS | *VNNs* | *VNNs* | VCC | VNNs |
| gn | VSS | VSS | VNNs | VNNs | VSS/VNNs | VSS | VNNs |
| #/ patch | 1 | m | 1 | m | m + 1 | m + 1 | m + 1 |

Some embodiments, as shown by way of example in Table 2, provide a decoder circuitry that is adapted to select an address line by biasing the address line to a positive bias or to a negative bias without changing gate biases of one or more, such as all, unselected remaining address lines, as suggested in Table 2 by way of the unchanging biases shown in bold and italics. In this way, energy losses $CV^2$ caused by overcoming the capacitance of a large number m PMOS or NMOS devices may be mitigated. In particular, while the current state of the art, as noted above with respect to FIG. 5C, keeps each lbwld at VSS or ground in the idle state of the decoder by turning on both the PMOS and the NMOS in all m switches 402b for the deselected address lines (lbwld), some embodiments contemplate achieving an idle state for the decoder by floating one or more lbwld to VSS, that is, by floating one or more lbwld to a FLVSS (floating VSS) bias in the idle state. The FLVSS for the one or more lbwld may be achieved by turning off the PMOS and the NMOS for the one or more lbwld in the associated switch in the idle state of the decoder.

Referring now in particular to FIG. 6C and Table 2, in the idle state, according to one embodiment, the PMOS of switches 402 (i.e. noting that the switches, as mentioned previously, exist for each lbwl) may be turned off by biasing lselp to VPPs, and gp to either VPPs or VSS (according to some embodiments, a memory device may be configured to be set at idle with gp only at VSS, only at VPPs, or with gp at either VSS or VPPs). In this way, for the PMOS, because the gate voltage at lselp (for both the lbwls (to be selected later) and the lbwld (to be deselected later)) is equal to or higher than the bias at gp, the PMOS device in switches 402 is off. In addition, in the idle state, according to this same embodiment, the NMOS of switches 402 may be turned off by biasing lseln to VNNs, and gn to either VNNs or VSS (according to some embodiments, a memory device may be configured to be set at idle with gn only at VNNs, only at VSS, or with gn at either VNNs or VSS). In this way, for the NMOS, because the gate voltage at lselp is equal to or less than the bias at gn, the NMOS device in switches 402 is off. Thus, in the idle state, according to some embodiments, the PMOS and the NMOS of switches of corresponding address lines lbwl are off, and the address lines are therefore at FLVSS.

We refer now in particular to FIG. 6A and Table 2, where we will address the biasing of lbwls to a positive bias. As shown in FIG. 6A and in Table 2, moving from the idle state at FIG. 6C to a positive bias to the selected address line lbwls would involve changing the gate bias of the PMOS and NMOS of the switch 402a of the selected address line lbwls, but advantageously not changing the bias of the PMOS or NMOS of the switch for the deselected address lines lbwld. The lselpd and lselnd for the deselected address lines are the same as between the idle state and the positive bias of lbwls, and, as a result, the need to expend energy to overcome the capacitance of a large number m of PMOS or NMOS devices to deselect m address lines is effectively obviated with the above approach. Although, according to the embodiment of FIG. 6A, the bias of gp may have to change (from VSS at idle to VPP at lbwls positive bias state if the bias of gp was VSS at the idle state), and the bias of gn may have to change (from VNNs at idle to VSS at lbwls positive bias state if the bias of gn was VSS at the idle state), because gp and gn are common lines, and because the PMOS or the NMOS of the switch of lbwls correspond to one MOSFET whose gate is to undergo a bias change (rather than m MOSFETs according to the state of the art), some embodiments advantageously mitigate the energy impact of decoder addressing in 3D crosspoint memory architectures.

We refer now in particular to FIG. 6B and Table 2, where we will address the biasing of lbwls to a negative bias. As shown in FIG. 6B and in Table 2, moving from the idle state at FIG. 6C to a negative bias to the selected address line lbwls would involve changing the gate bias of the PMOS and NMOS of the switch 402a of the selected address line lbwls, but advantageously not changing the bias of the PMOS or NMOS of the switch for the deselected address lines lbwld. The lselpd and lselnd for the deselected address lines are the same as between the idle state and the negative bias of lbwls, and, as a result, the need to expend energy to overcome the capacitance of a large number m of PMOS or NMOS devices to deselect m address lines is again effectively obviated with the above approach. Although, according to the embodiment of FIG. 6B, the bias of gp may have to change (from VPPs at idle to VSS at lbwls negative bias state if the bias of gp was VPPs at the idle state), and the bias of gn may have to change (from VSS at idle to VNNs at lbwls negative bias state if the bias of gn was VNNs at the idle state), because gp and gn are common lines, and because the PMOS or the NMOS of the switch of lbwls correspond to one MOSFET whose gate is to undergo a bias change (rather than m MOSFETs according to the state of the art), some embodiments, as noted previously with respect to the example of FIG. 6A, advantageously mitigate the energy impact of decoder addressing in 3D crosspoint memory architectures.

Embodiments have recognized that a majority of the energy expenditure in decoder memory addressing may be attributed to the deselection process, and specifically to the toggling of the PMOS or NMOS gates of deselecting switches (switches that are to execute deselection of an address line, such as lbwld). The capacitance of nodes associated with the PMOS and NMOS of deselecting switches is typically quite high. Embodiments address this issue by substantially doing away with a need to toggle the gate biases of PMOS or NMOS devices in deselecting switches of the 3D crosspoint memory decoders.

We note that, although not shown in Table 1, but as shown in FIGS. 5A-5C and 6A-6E, the body bias in all cases may be set to VPP for the PMOS's and to VNN for the NMOS's.

Figure 6D:
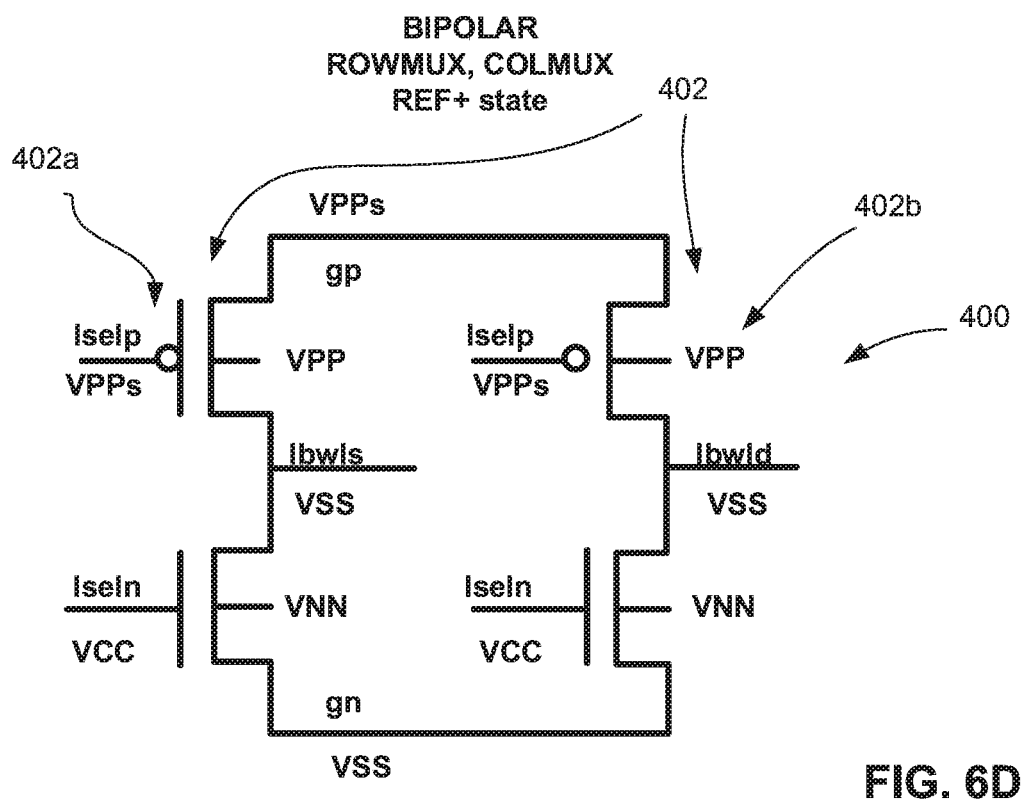
FIG. 6D is a schematic illustration of the portion of the decoder circuitry of FIG. 4, showing nodes of the decoder circuitry biased according to some embodiment to refresh the decoder circuitry to a positive refresh state.
Figure 6E:
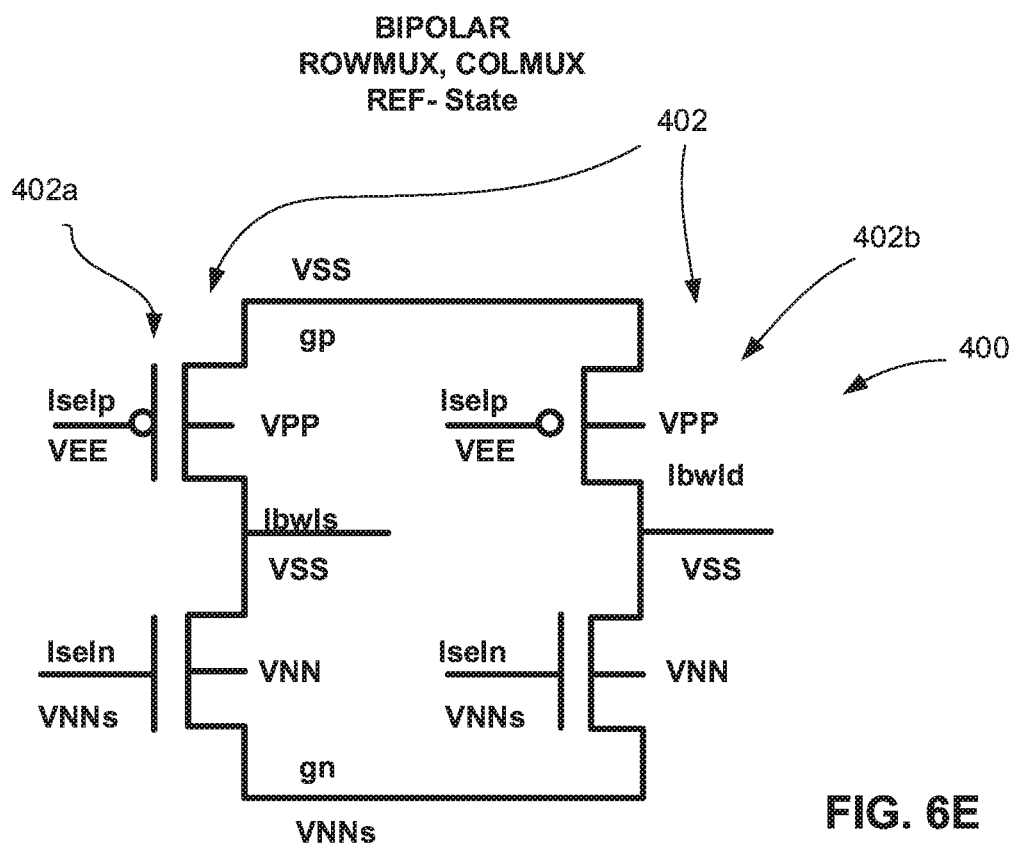
FIG. 6E is a schematic illustration of the portion of the decoder circuitry of FIG. 4, showing nodes of the decoder circuitry biased according to some embodiments to refresh the decoder circuitry to a negative refresh state.

Reference is now made to FIGS. 6D and 6E in the context of Table 2. FIGS. 6D and 6E show the portion of the decoder of FIG. 4 with nodes of the decoder circuitry biased to a positive refresh state REF+ or to a negative refresh state REF− according to some embodiments as shown by way of the indicated corresponding column biases in Table 2 above. A "refresh state" as used herein may refer to a state of the decoder where the address lines of a given decoder are all driven (not floated) to a known initial state, such as VSS. Thus, in a refresh state, at least one of the PMOS or NMOS devices of the decoder circuitry is turned on in order to drive address lines of that decoder circuitry to VSS rather than floating them to FLVSS.

According to some embodiments, a decoder circuitry a portion 400 of which is shown in FIGS. 6A-6E may be re-initialized from an idle state where the address lines are floated to a REF+ state (FIG. 6D) and/or a REF− state (FIG. 6E), where the reference state of REF+ or REF− force the address lines to a known state. Reinitialization may be required at power up in any event to ensure all address lines of a given decoder are at a known bias. In addition, during operation, addressing functions according to some embodiments may require, for a given decoder circuitry, moving from the idle state to a read or write operation by selecting one address line and deselecting a number m remaining address lines. After the memory operation has been completed, the node biases of the decoder circuitry may go back to idle in order to make possible a next memory operation. After a number of such memory operations, a refresh operation may be needed for a number of reasons, for example because of leakage with respect to decoder nodes which may make the maintaining of a floating bias, such as FLVSS, difficult in practice for the address lines in an idle state, which leakage may be augmented with each memory operation. Therefore, reinitialization may be set, according to some embodiments, to occur cyclically, and/or it may be based on the number of memory operations performed, as a function of time (such as every tens of milliseconds or hundreds of milliseconds b way of example), and/or determined experimentally according to application needs.

A reinitialization by way of a refresh operation, according to some embodiments, turns on the NMOS's of the decoder and turns off the PMOS' of the decoder for a REF+ state, and turns off the NMOS's of the decoder and turns on the PMOS' of the decoder for a REF− state. Doing so would drive the address lines to VSS (it would reset them after noise or leakage or other issues may have forced them from FLVSS to a bias other than FLVSS).

FIG. 6D depicts the portion of the decoder circuitry of FIG. 4, showing nodes of the decoder circuitry biased according to some embodiments to place the decoder in a positive refresh state, that is, to a state where, as noted above, the NMOS's are turned on and the PMOS's turned off. At the REF+ state, the gate bias of the PMOS's and of the gp supply line may be set to VPPs, thus turning off the PMOS's. The gate bias of the NMOS's may be set to VCC (a positive bias as noted above) and the gn supply line may be set to VSS (ground), thus turning on the NMOS's (since the voltage differential between VCC and VSS would be positive and above a threshold voltage of the NMOS). Such a bias configuration would drive/force the lbwl address lines to VSS. Bias voltages for REF+ are shown in Table 2. After reinitialization, the biases may be returned to those in the idle state before a next memory operation begins.

FIG. 6E depicts the portion of the decoder circuitry of FIG. 4, showing nodes of the decoder circuitry biased according to some embodiments to place the decoder in a negative refresh state, that is, to a state where, as noted above, the NMOS's are turned off and the PMOS's turned on. At the REF− state, the gate bias of the PMOS's may be set to VEE (a negative bias as noted above) and the gp supply line may be set to VSS, thus turning off the PMOS's (since the voltage differential between VEE and VSS would be negative and above a threshold voltage of the PMOS). The gate bias of the NMOS's and of the gn supply line may be set to VNNs, thus turning off the NMOS's. Such a bias configuration would drive/force the lbwl address lines to VSS. Bias voltages for REF− are shown in Table 2. After reinitialization, the biases may be returned to those in the idle state before a next memory operation begins.

Referring to Table 2, it is clear that reinitialization by way of a refresh operation would in any event require a MOSFET gate bias change for each decoder circuitry for at least one of the corresponding PMOS or NMOS device. For REF+, the lseln bias would be changed from VNNs at idle to VCC. For REF−, the lselp bias would be changed from VPPs to VEE. Although a wholesale bias change at all PMOS or NMOS gates of all address lines in a given decoder may be needed for a refresh operation, it is easier and less energetically costly to perform a refresh operation periodically on all gates of the PMOS's or NMOS's than to change all PMOS or NMOS gates of all address lines every time a memory operation (e.g. read/write/erase) takes place, such as happens according to the state of the art.

According to some embodiments, a decoder circuitry may be refreshed only to REF+, only to REF−, or it may be refreshed to either REF+ or REF−. It is noted that the effect of REF+ or REF− is identical: driving all address lines to a known bias, such as VSS. Where both are available, a decision as to which one to use may be arbitrary, or it may be based on the amount of energy expenditure needed to go from idle to the refresh state. For example, where the last idle state had gp at VPPs, it may take less energy to go from idle to REF+ than to REF−. Similarly, where the last idle state had gp at VSS, it may take less energy to go from idle to REF−. However, embodiments are not so limited.

Some embodiments provide a bipolar decoder architecture that reduces the $CV^2$ energy impact of WL or BL addressing compared with current art solutions. Some embodiments provide a memory control to float address lines at an idle state at a known voltage, such as ground, and to float deselected address lines (rows/columns) with an optional mechanism to provide periodic refresh to bring a 3D crosspoint memory array back to its initial state where address lines at idle are not floated.

Floating deselected WL/BL states when an address line is selected reduce the number of decoder gates that need to be charged and discharged, resulting in an overall reduction of $CV^2$ energy compared with current art.

Figure 7:
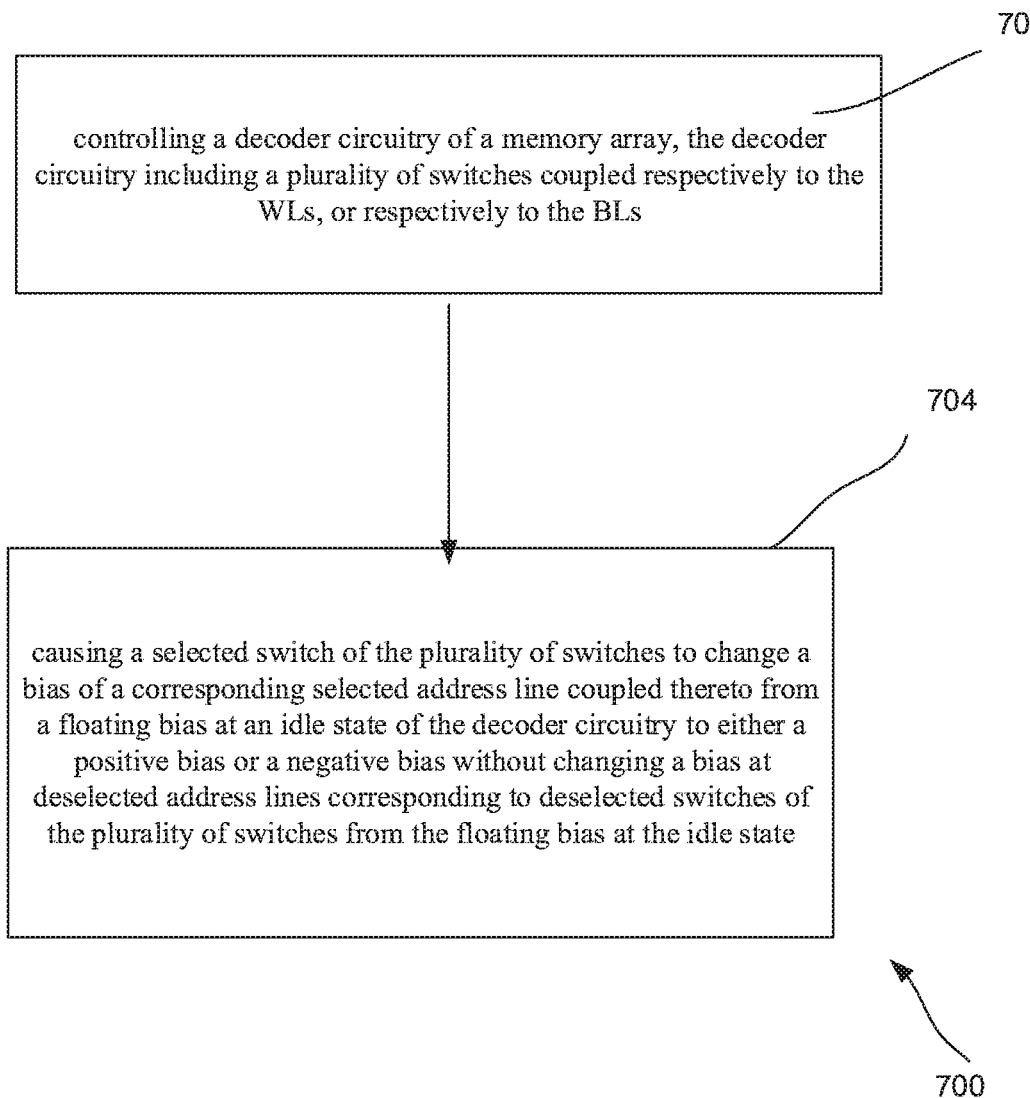
FIG. 7 illustrates an example process for logging commands and associated addresses for a memory debug operation in accordance with certain embodiments.

FIG. 7 illustrates an example of a process 1200 according to some embodiments. The process includes, at operation 1202, controlling a decoder circuitry of a memory array, the decoder circuitry including a plurality of switches coupled respectively to the WLs, or respectively to the BLs; and at operation 1204, causing a selected switch of the plurality of switches to change a bias of a corresponding selected address line coupled thereto from a floating bias at an idle state of the decoder circuitry to either a positive bias or a negative bias without changing a bias at deselected address lines corresponding to deselected switches of the plurality of switches from the floating bias at the idle state. The flow of FIG. 7 may be performed by way of example at the memory partition controller 210 of FIG. 2, at the memory controller of the CPU, or in a distributed manner across a number of controllers.

The flow described in FIG. 7 is merely representative of operations that may occur in particular embodiments. In other embodiments, additional operations may be performed by the components of system 100. Various embodiments of the present disclosure contemplate any suitable signaling mechanisms for accomplishing the functions described herein. Some of the operations illustrated in FIG. 12 may be repeated, combined, modified, or deleted where appropriate. Additionally, operations may be performed in any suitable order without departing from the scope of particular embodiments.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or retransmission of the electrical signal is performed, a new copy is made. Thus, a communication provider or a network provider may store on a tangible, machine-readable storage medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102, external I/O controller 104, processor 108, cores 114A and 114B, I/O controller 110, CPU memory controller 112, storage device 106, system memory device 107, memory chip 116, storage device controller 118, address translation engine 120, memory partition 122, program control logic 124, chip controller 126, memory array 306, memory partition controller 310, word line control logic 314, bit line control logic 316, or other entity or component described herein, or subcomponents of any of these. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware, or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a The machine-readable storage medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage medium used in the transmission of information over the Internet via electrical, optical, acoustical or other forms of propagated signals (e.g., carrier waves, infrared signals, digital signals, etc.). Accordingly, the computer-readable medium includes any type of tangible machine-readable storage medium suitable for storing or transmitting electronic instructions or information in a form readable by a machine (e.g., a computer).

Some examples of embodiments are provided below.

Example 1 includes an apparatus of a memory device comprising: memory controller circuitry; an a memory controller interface coupled to the memory controller circuitry and adapted to couple the memory controller circuitry to a decoder circuitry of a memory array, the memory array including address lines comprising wordlines (WLs) and bitlines (BLs), and the decoder circuitry including a plurality of switches coupled respectively to the WLs, or respectively to the BLs; wherein the memory controller circuitry is to control the decoder circuitry by causing a selected switch of the plurality of switches to change a bias of a corresponding selected address line coupled thereto from a floating bias at an idle state of the decoder circuitry to either a positive bias or a negative bias without changing a bias at deselected address lines corresponding to deselected switches of the plurality of switches from the floating bias at the idle state.

Example 2 includes the subject matter of Example 1, and optionally, wherein the memory controller circuitry is to cause the idle state of the decoder circuitry by causing the floating bias at the address lines.

Example 3 includes the subject matter of Example 2, and optionally, wherein the floating bias corresponds to a floating reference ground voltage (FLVSS).

Example 4 includes the subject matter of Example 1, and optionally, wherein the plurality of switches each include a pair of complementary transistors including a positive-type (p-type) metal oxide semiconductor transistor (PMOS) and a negative-type (n-type) MOS transistor (NMOS).

Example 5 includes the subject matter of Example 4, and optionally, wherein the memory controller circuitry is cause the floating bias at the address lines at the idle state by turning off the PMOS and the NMOS of each of the plurality of switches.

Example 6 includes the subject matter of Example 5, and optionally, wherein the memory controller circuitry is cause the floating bias at the address lines at the idle state by: applying a gate bias to the PMOS of each of the plurality of switches that corresponds to a positive selection bias voltage (VPPs); applying a gate bias to the NMOS of each of the plurality of switches that corresponds to a negative selection bias voltage (VNNs); applying a source voltage to the PMOS (gp) of each of the plurality of switches that is equal to either a reference ground voltage (VSS) or VPPs; and applying a source voltage to the NMOS (gn) of each of the plurality of switches that is equal to either VSS or VNNs.

Example 7 includes the subject matter of Example 4, and optionally, wherein the memory controller circuitry is to cause the selected switch to change the bias of the corresponding selected address line coupled thereto from a floating bias at the idle state to the positive bias or to the negative bias by applying a gate bias corresponding to a reference ground voltage (VSS) to both the PMOS and the NMOS of the selected switch while leaving a gate bias of both the PMOS and the NMOS of each of the deselected switches unchanged as compared with the idle state.

Example 8 includes the subject matter of Example 4, and optionally, wherein the memory controller circuitry is to cause the decoder circuitry to change from the idle state to a refresh state and back to the idle state after a plurality of memory operations each involving a biasing of selected address lines to positive or negative voltage values followed by a return of address lines to the idle state, wherein the refresh state corresponds to a state of the decoder circuitry where the address lines are biased at a known voltage that is not a floating voltage.

Example 9 includes the subject matter of Example 8, and optionally, wherein the known voltage corresponds to a reference ground voltage (VSS).

Example 10 includes the subject matter of Example 8, and optionally, wherein the refresh state includes at least one of a positive refresh state where the PMOS of each of the plurality of switches is off and the NMOS of each of the plurality of switches is on, or a negative refresh state where the NMOS of each of the plurality of switches is off and the PMOS of each of the plurality of switches is on.

Example 11 includes a system comprising: a memory array including memory cells and address lines comprising wordlines (WLs) and bitlines (BLs); memory controller circuitry; a WL decoder circuitry coupled to the memory controller circuitry and including a plurality of WL switches respectively coupled to the WLs; a BL decoder circuitry coupled to the memory controller circuitry and including a plurality of BL switches respectively coupled to the BLs; wherein the memory controller circuitry is to: control the WL decoder circuitry by causing a selected WL switch of the plurality of WL switches to change a bias of a corresponding selected WL coupled thereto from a floating WL bias at an idle state of the WL decoder circuitry to either a positive WL bias or a negative WL bias without changing a WL bias at deselected WLs corresponding to deselected WL switches of the plurality of WL switches from the floating WL bias at the idle state of the WL decoder circuitry; and control the BL decoder circuitry by causing a selected BL switch of the plurality of BL switches to change a bias of a corresponding selected BL coupled thereto from a floating BL bias at an idle state of the BL decoder circuitry to either a positive BL bias or a negative BL bias without changing a BL bias at deselected BLs corresponding to deselected BL switches of the plurality of BL switches from the floating BL bias at the idle state of the BL decoder circuitry.

Example 12 includes the subject matter of Example 11, and optionally, wherein the memory controller circuitry is to at least one of cause the idle state of the WL decoder circuitry by causing the floating WL bias at the WLs, or cause the idle state of the BL decoder circuitry by causing the floating BL bias at the BLs.

Example 13 includes the subject matter of Example 12, and optionally, wherein at least one of the floating WL bias or the floating BL bias correspond to a floating reference ground voltage (FLVSS).

Example 14 includes the subject matter of Example 11, and optionally, wherein the plurality of WL switches and the plurality of BL switches each include a pair of complementary transistors including a positive-type (p-type) metal oxide semiconductor transistor (PMOS) and a negative-type (n-type) MOS transistor (NMOS).

Example 15 includes the subject matter of Example 14, and optionally, wherein the memory controller circuitry is cause the floating WL bias and the floating BL bias at the idle state by turning off the PMOS and the NMOS of each of the plurality of WL switches and BL switches.

Example 16 includes the subject matter of Example 15, and optionally, wherein the memory controller circuitry is cause the floating WL bias at the idle state of the WL decoder circuitry and the floating BL bias at the idle state of the BL decoder circuitry by: applying a gate bias to the PMOS of each of the plurality of WL switches and BL switches corresponding to a positive selection bias voltage (VPPs); applying a gate bias to the NMOS of each of the plurality of WL switches and BL switches corresponding to a negative selection bias voltage (VNNs); applying a source voltage to the PMOS (gp) of each of the plurality of WL switches and BL switches equal to either a reference ground voltage (VSS) or VPPs; and applying a source voltage to the NMOS (gn) of each of the plurality of WL switches and BL switches equal to either VSS or VNNs.

Example 17 includes the subject matter of Example 14, and optionally, wherein the memory controller circuitry is to at least one of: cause the WL switch to change the bias of the corresponding selected WL coupled thereto from a floating WL bias at the idle state of the WL decoder circuitry to the positive WL bias or to the negative WL bias by applying a gate bias corresponding to a reference ground voltage (VSS) to both the PMOS and the NMOS of the selected WL switch while leaving a gate bias of both the PMOS and the NMOS of each of the deselected WL switches unchanged as compared with the idle state of the WL decoder circuitry; or cause the BL switch to change the bias of the corresponding selected BL coupled thereto from a floating BL bias at the idle state of the BL decoder circuitry to the positive BL bias or to the negative BL bias by applying a gate bias corresponding to a reference ground voltage (VSS) to both the PMOS and the NMOS of the selected BL switch while leaving a gate bias of both the PMOS and the NMOS of each of the deselected BL switches unchanged as compared with the idle state of the BL decoder circuitry.

Example 18 includes the subject matter of Example 14, and optionally, wherein the memory controller circuitry is to cause at least one of the WL decoder circuitry or the BL decoder circuitry to change from the idle state thereof to a refresh state and back to the idle state after a plurality of memory operations each involving a biasing of selected address lines to positive or negative voltage values followed by a return of address lines to the idle state, wherein the refresh state corresponds to a state of the WL decoder circuitry or the BL decoder circuitry where, respectively, the WLs or the BLs are biased at a known voltage that is not a floating voltage.

Example 19 includes the subject matter of Example 18, and optionally, wherein the known voltage corresponds to a reference ground voltage (VSS).

Example 20 includes the subject matter of Example 18, and optionally, wherein: the refresh state of the WL decoder circuitry includes at least one of a positive refresh state where the PMOS of each of the WL switches is off and the NMOS of each of the WL switches is on, or a negative refresh state where the NMOS of each of the WL switches is off and the PMOS of each of the WL switches is on; and the refresh state of the BL decoder circuitry includes at least one of a positive refresh state where the PMOS of each of the BL switches is off and the NMOS of each of the BL switches is on, or a negative refresh state where the NMOS of each of the BL switches is off and the PMOS of each of the BL switches is on.

Example 21 includes a method of addressing memory cells in a memory array including address lines comprising wordlines (WLs) and bitlines (BLs), the method comprising: controlling a decoder circuitry of a memory array, the decoder circuitry including a plurality of switches coupled respectively to the WLs, or respectively to the BLs; and causing a selected switch of the plurality of switches to change a bias of a corresponding selected address line coupled thereto from a floating bias at an idle state of the decoder circuitry to either a positive bias or a negative bias without changing a bias at deselected address lines corresponding to deselected switches of the plurality of switches from the floating bias at the idle state.

Example 22 includes the subject matter of Example 21, and optionally, further including causing the idle state of the decoder circuitry by causing the floating bias at the address lines.

Example 23 includes the subject matter of Example 22, and optionally, wherein the floating bias corresponds to a floating reference ground voltage (FLVSS).

Example 24 includes the subject matter of Example 21, and optionally, wherein the plurality of switches each include a pair of complementary transistors including a positive-type (p-type) metal oxide semiconductor transistor (PMOS) and a negative-type (n-type) MOS transistor (NMOS).

Example 25 includes the subject matter of Example 24, and optionally, further including causing the floating bias at the address lines at the idle state by turning off the PMOS and the NMOS of each of the plurality of switches.

Example 26 includes the subject matter of Example 25, and optionally, further including causing the floating bias at the address lines at the idle state by: applying a gate bias to the PMOS of each of the plurality of switches that corresponds to a positive selection bias voltage (VPPs); applying a gate bias to the NMOS of each of the plurality of switches that corresponds to a negative selection bias voltage (VNNs); applying a source voltage to the PMOS (gp) of each of the plurality of switches that is equal to either a reference ground voltage (VSS) or VPPs; and applying a source voltage to the NMOS (gn) of each of the plurality of switches that is equal to either VSS or VNNs.

Example 27 includes the subject matter of Example 24, and optionally, further including causing the selected switch to change the bias of the corresponding selected address line coupled thereto from a floating bias at the idle state to the positive bias or to the negative bias by applying a gate bias corresponding to a reference ground voltage (VSS) to both the PMOS and the NMOS of the selected switch while leaving a gate bias of both the PMOS and the NMOS of each of the deselected switches unchanged as compared with the idle state.

Example 28 includes the subject matter of Example 24, and optionally, further including causing the decoder circuitry to change from the idle state to a refresh state and back to the idle state after a plurality of memory operations each involving a biasing of selected address lines to positive or negative voltage values followed by a return of address lines to the idle state, wherein the refresh state corresponds to a state of the decoder circuitry where the address lines are biased at a known voltage that is not a floating voltage.

Example 29 includes the subject matter of Example 28, and optionally, wherein the known voltage corresponds to a reference ground voltage (VSS).

Example 30 includes the subject matter of Example 28, and optionally, wherein the refresh state includes at least one of a positive refresh state where the PMOS of each of the plurality of switches is off and the NMOS of each of the plurality of switches is on, or a negative refresh state where the NMOS of each of the plurality of switches is off and the PMOS of each of the plurality of switches is on.

Example 31 includes a tangible non-transitory machine-readable storage medium having instructions stored thereon, the instructions when executed by a machine to cause the machine to: control a decoder circuitry of a memory array that includes address lines comprising wordlines (WLs) and bitlines (BLs), the decoder circuitry including a plurality of switches coupled respectively to the WLs, or respectively to the BLs; and cause a selected switch of the plurality of switches to change a bias of a corresponding selected address line coupled thereto from a floating bias at an idle state of the decoder circuitry to either a positive bias or a negative bias without changing a bias at deselected address lines corresponding to deselected switches of the plurality of switches from the floating bias at the idle state.

Example 32 includes the subject matter of Example 31, and optionally, the instructions further to cause the machine to cause the idle state of the decoder circuitry by causing the floating bias at the address lines.

Example 33 includes the subject matter of Example 32, and optionally, wherein the floating bias corresponds to a floating reference ground voltage (FLVSS).

Example 34 includes the subject matter of Example 31, and optionally, wherein the plurality of switches each include a pair of complementary transistors including a positive-type (p-type) metal oxide semiconductor transistor (PMOS) and a negative-type (n-type) MOS transistor (NMOS).

Example 35 includes the subject matter of Example 34, and optionally, the instructions further to cause the machine to cause the floating bias at the address lines at the idle state by turning off the PMOS and the NMOS of each of the plurality of switches.

Example 36 includes the subject matter of Example 35, and optionally, the instructions further to cause the machine to cause the floating bias at the address lines at the idle state by: applying a gate bias to the PMOS of each of the plurality of switches that corresponds to a positive selection bias voltage (VPPs); applying a gate bias to the NMOS of each of the plurality of switches that corresponds to a negative selection bias voltage (VNNs); applying a source voltage to the PMOS (gp) of each of the plurality of switches that is equal to either a reference ground voltage (VSS) or VPPs; and applying a source voltage to the NMOS (gn) of each of the plurality of switches that is equal to either VSS or VNNs.

Example 37 includes the subject matter of Example 34, and optionally, the instructions further to cause the machine to cause the selected switch to change the bias of the corresponding selected address line coupled thereto from a floating bias at the idle state to the positive bias or to the negative bias by applying a gate bias corresponding to a reference ground voltage (VSS) to both the PMOS and the NMOS of the selected switch while leaving a gate bias of both the PMOS and the NMOS of each of the deselected switches unchanged as compared with the idle state.

Example 38 includes the subject matter of Example 34, and optionally, the instructions further to cause the machine to cause the decoder circuitry to change from the idle state to a refresh state and back to the idle state after a plurality of memory operations each involving a biasing of selected address lines to positive or negative voltage values followed by a return of address lines to the idle state, wherein the refresh state corresponds to a state of the decoder circuitry where the address lines are biased at a known voltage that is not a floating voltage.

Example 39 includes the subject matter of Example 38, and optionally, wherein the known voltage corresponds to a reference ground voltage (VSS). The device of claim 38, wherein the refresh state includes at least one of a positive refresh state where the PMOS of each of the plurality of switches is off and the NMOS of each of the plurality of switches is ON, or a negative refresh state where the NMOS of each of the plurality of switches is off and the PMOS of each of the plurality of switches is ON.

Example 40 includes a device comprising: one or more processors and one or more computer-readable media comprising instructions that, when executed by the one or more processors, cause the one or more processors to perform the method, techniques, or process as described in or related to any of the Examples above, or portions thereof.

Example 41 includes a signal as described in or related to any of the Examples above, or portions or parts thereof.

Example 42 includes a datagram, packet, frame, segment, protocol data unit (PDU), or message as described in or related to any of the Examples above, or portions or parts thereof, or otherwise described in the present disclosure.

Example 43 includes a signal encoded with data as described in or related to any of the Examples above, or portions or parts thereof, or otherwise described in the present disclosure.

Example 44 includes a signal encoded with a datagram, packet, frame, segment, protocol data unit (PDU), or message as described in or related to any of the Examples above, or portions or parts thereof, or otherwise described in the present disclosure.

Example 45 includes an electromagnetic signal carrying computer-readable instructions, wherein execution of the computer-readable instructions by one or more processors is to cause the one or more processors to perform the method, techniques, or process as described in or related to any of the Examples above, or portions thereof.

Example 46 includes a computer program comprising instructions, wherein execution of the program by a processing element is to cause the processing element to carry out the method, techniques, or process as described in or related to any of the Examples above, or portions thereof.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus of a non-volatile memory device comprising:
   memory controller circuitry; and
   a memory controller interface coupled to the memory controller circuitry and adapted to couple the memory controller circuitry to a decoder circuitry of a memory array, the memory array including address lines comprising wordlines (WLs) and bitlines (BLs), and the decoder circuitry including a plurality of switches coupled respectively to the WLs, or respectively to the BLs;
   wherein the memory controller circuitry is to control the decoder circuitry by causing a selected switch of the plurality of switches to change a bias of a corresponding selected address line coupled thereto from a floating bias at an idle state of the decoder circuitry to either a positive bias or a negative bias without changing a bias at deselected address lines corresponding to deselected switches of the plurality of switches from the floating bias at the idle state.

2. The apparatus of claim 1, wherein the memory controller circuitry is to cause the idle state of the decoder circuitry by causing the floating bias at the address lines.

3. The apparatus of claim 2, wherein the floating bias corresponds to a floating reference ground voltage (FLVSS).

4. The apparatus of claim 1, wherein the plurality of switches each include a pair of complementary transistors including a positive-type (p-type) metal oxide semiconductor transistor (PMOS) and a negative-type (n-type) MOS transistor (NMOS).

5. The apparatus of claim 4, wherein the memory controller circuitry is to cause the floating bias at the address lines at the idle state by turning off the PMOS and the NMOS of each of the plurality of switches.

6. The apparatus of claim 5, wherein the memory controller circuitry is to cause the floating bias at the address lines at the idle state by:
   applying a gate bias to the PMOS of each of the plurality of switches that corresponds to a positive selection bias voltage (VPPs);
   applying a gate bias to the NMOS of each of the plurality of switches that corresponds to a negative selection bias voltage (VNNs);
   applying a source voltage to the PMOS (gp) of each of the plurality of switches that is equal to either a reference ground voltage (VSS) or VPPs; and
   applying a source voltage to the NMOS (gn) of each of the plurality of switches that is equal to either VSS or VNNs.

7. The apparatus of claim 4, wherein the memory controller circuitry is to cause the selected switch to change the bias of the corresponding selected address line coupled thereto from a floating bias at the idle state to the positive bias or to the negative bias by applying a gate bias corresponding to a reference ground voltage (VSS) to both the PMOS and the NMOS of the selected switch while leaving a gate bias of both the PMOS and the NMOS of each of the deselected switches unchanged as compared with the idle state.

8. The apparatus of claim 4, wherein the memory controller circuitry is to cause the decoder circuitry to change from the idle state to a refresh state and back to the idle state after a plurality of memory operations each involving a biasing of selected address lines to positive or negative voltage values followed by a return of address lines to the idle state, wherein the refresh state corresponds to a state of the decoder circuitry where the address lines are biased at a known voltage that is not a floating voltage.

9. The apparatus of claim 8, wherein the known voltage corresponds to a reference ground voltage (VSS).

10. The apparatus of claim 8, wherein the refresh state includes at least one of a positive refresh state where the PMOS of each of the plurality of switches is off and the NMOS of each of the plurality of switches is on, or a negative refresh state where the NMOS of each of the plurality of switches is off and the PMOS of each of the plurality of switches is on.

11. A system comprising:
   a memory array including memory cells and address lines comprising wordlines (WLs) and bitlines (BLs);
   memory controller circuitry;
   a WL decoder circuitry coupled to the memory controller circuitry and including a plurality of WL switches respectively coupled to the WLs; and
   a BL decoder circuitry coupled to the memory controller circuitry and including a plurality of BL switches respectively coupled to the BLs;
   wherein the memory controller circuitry is to:
      control the WL decoder circuitry by causing a selected WL switch of the plurality of WL switches to change a bias of a corresponding selected WL coupled thereto from a floating WL bias at an idle state of the WL decoder circuitry to either a positive WL bias or a negative WL bias without changing a WL bias at deselected WLs corresponding to deselected WL switches of the plurality of WL switches from the floating WL bias at the idle state of the WL decoder circuitry; and
      control the BL decoder circuitry by causing a selected BL switch of the plurality of BL switches to change a bias of a corresponding selected BL coupled thereto from a floating BL bias at an idle state of the BL decoder circuitry to either a positive BL bias or a negative BL bias without changing a BL bias at deselected BLs corresponding to deselected BL switches of the plurality of BL switches from the floating BL bias at the idle state of the BL decoder circuitry.

12. The system of claim 11, wherein the memory controller circuitry is to at least one of cause the idle state of the WL decoder circuitry by causing the floating WL bias at the WLs, or cause the idle state of the BL decoder circuitry by causing the floating BL bias at the BLs.

13. The system of claim 11, wherein the plurality of WL switches and the plurality of BL switches each include a pair of complementary transistors including a positive-type (p-type) metal oxide semiconductor transistor (PMOS) and a negative-type (n-type) MOS transistor (NMOS).

14. The system of claim 13, wherein the memory controller circuitry is to cause the floating WL bias and the floating BL bias at the idle state by turning off the PMOS and the NMOS of each of the plurality of WL switches and BL switches.

15. The system of claim 14, wherein the memory controller circuitry is to cause the floating WL bias at the idle state of the WL decoder circuitry and the floating BL bias at the idle state of the BL decoder circuitry by:
   applying a gate bias to the PMOS of each of the plurality of WL switches and BL switches corresponding to a positive selection bias voltage (VPPs);
   applying a gate bias to the NMOS of each of the plurality of WL switches and BL switches corresponding to a negative selection bias voltage (VNNs);

applying a source voltage to the PMOS (gp) of each of the plurality of WL switches and BL switches equal to either a reference ground voltage (VSS) or VPPs; and applying a source voltage to the NMOS (gn) of each of the plurality of WL switches and BL switches equal to either VSS or VNNs.

16. A method of addressing memory cells in a memory array including address lines comprising wordlines (WLs) and bitlines (BLs), the method comprising:

controlling a decoder circuitry of a memory array, the decoder circuitry including a plurality of switches coupled respectively to the WLs, or respectively to the BLs; and causing a selected switch of the plurality of switches to change a bias of a corresponding selected address line coupled thereto from a floating bias at an idle state of the decoder circuitry to either a positive bias or a negative bias without changing a bias at deselected address lines corresponding to deselected switches of the plurality of switches from the floating bias at the idle state.

17. The method of claim 16, wherein the plurality of switches each include a pair of complementary transistors including a positive-type (p-type) metal oxide semiconductor transistor (PMOS) and a negative-type (n-type) MOS transistor (NMOS).

18. The method of claim 17, further including causing the floating bias at the address lines at the idle state by turning off the PMOS and the NMOS of each of the plurality of switches.

19. The method of claim 18, further including causing the floating bias at the address lines at the idle state by:

applying a gate bias to the PMOS of each of the plurality of switches that corresponds to a positive selection bias voltage (VPPs);

applying a gate bias to the NMOS of each of the plurality of switches that corresponds to a negative selection bias voltage (VNNs);

applying a source voltage to the PMOS (gp) of each of the plurality of switches that is equal to either a reference ground voltage (VSS) or VPPs; and applying a source voltage to the NMOS (gn) of each of the plurality of switches that is equal to either VSS or VNNs.

20. The method of claim 17, further including causing the decoder circuitry to change from the idle state to a refresh state and back to the idle state after a plurality of memory operations each involving a biasing of selected address lines to positive or negative voltage values followed by a return of address lines to the idle state, wherein the refresh state corresponds to a state of the decoder circuitry where the address lines are biased at a known voltage that is not a floating voltage.

21. The method of claim 20, wherein the refresh state includes at least one of a positive refresh state where the PMOS of each of the plurality of switches is off and the NMOS of each of the plurality of switches is on, or a negative refresh state where the NMOS of each of the plurality of switches is off and the PMOS of each of the plurality of switches is on.

22. A tangible non-transitory machine-readable storage medium having instructions stored thereon, the instructions when executed by a machine to cause the machine to:

control a decoder circuitry of a memory array that includes address lines comprising wordlines (WLs) and bitlines (BLs), the decoder circuitry including a plurality of switches coupled respectively to the WLs, or respectively to the BLs; and cause a selected switch of the plurality of switches to change a bias of a corresponding selected address line coupled thereto from a floating bias at an idle state of the decoder circuitry to either a positive bias or a negative bias without changing a bias at deselected address lines corresponding to deselected switches of the plurality of switches from the floating bias at the idle state.

23. The machine-readable storage medium of claim 22, the instructions further to cause the machine to cause the idle state of the decoder circuitry by causing the floating bias at the address lines.

24. The machine-readable storage medium of claim 22, wherein the plurality of switches each include a pair of complementary transistors including a positive-type (p-type) metal oxide semiconductor transistor (PMOS) and a negative-type (n-type) MOS transistor (NMOS).

25. The machine-readable storage medium of claim 24, the instructions further to cause the machine to cause the floating bias at the address lines at the idle state by turning off the PMOS and the NMOS of each of the plurality of switches.

* * * * *